(12) United States Patent
Hiller et al.

(10) Patent No.: US 7,875,985 B2
(45) Date of Patent: Jan. 25, 2011

(54) MEMORY DEVICE

(75) Inventors: Dietmar Hiller, Munich (DE); Roberto Dossi, Unterschleissheim (DE); Andreas Knoblauch, Munich (DE)

(73) Assignee: Qimonda AG, Munich (DE)

( * ) Notice: Subject to any disclaimer, the term of this patent is extended or adjusted under 35 U.S.C. 154(b) by 376 days.

(21) Appl. No.: 11/644,044

(22) Filed: Dec. 22, 2006

(65) Prior Publication Data

US 2008/0150111 A1    Jun. 26, 2008

(51) Int. Cl.
*H01L 23/48* (2006.01)
*H01L 23/52* (2006.01)
*H01L 29/40* (2006.01)

(52) U.S. Cl. .............. 257/786; 257/686; 257/E23.024

(58) Field of Classification Search ............... 257/686, 257/784, 786, E23.024
See application file for complete search history.

(56) References Cited

U.S. PATENT DOCUMENTS

| | | | |
|---|---|---|---|
| 5,818,114 A | 10/1998 | Pendse et al. | |
| 5,951,304 A | 9/1999 | Wildes et al. | |
| 6,323,548 B1 * | 11/2001 | Hiraga | 257/692 |
| 6,376,904 B1 | 4/2002 | Haba et al. | |
| 6,476,506 B1 * | 11/2002 | O'Connor et al. | 257/786 |
| 6,731,011 B2 * | 5/2004 | Verma et al. | 257/777 |
| 6,900,528 B2 | 5/2005 | Mess et al. | |
| 2005/0093167 A1 * | 5/2005 | Saeki | 257/774 |

OTHER PUBLICATIONS

German Office Action dated Aug. 24, 2007.

* cited by examiner

*Primary Examiner*—David A Zarneke
*Assistant Examiner*—Jenny L Wagner
(74) *Attorney, Agent, or Firm*—Patterson & Sheridan, LLP

(57) ABSTRACT

A memory device comprising at least one memory stack of stacked memory dies which are staggered with respect to each other,
  each stacked memory die of said memory stack comprising along its edge die pads for bonding said stacked memory die to substrate pads of said memory device connectable to a control circuit,
  wherein each die pad of a stacked memory die which connects said memory die individually to said control circuit comprises an increased distance ($d_i$) in comparison to die pads of said stacked memory die which connect said stacked memory die in parallel with corresponding die pads of other stacked memory dies of said memory stack to said control circuit.

24 Claims, 19 Drawing Sheets

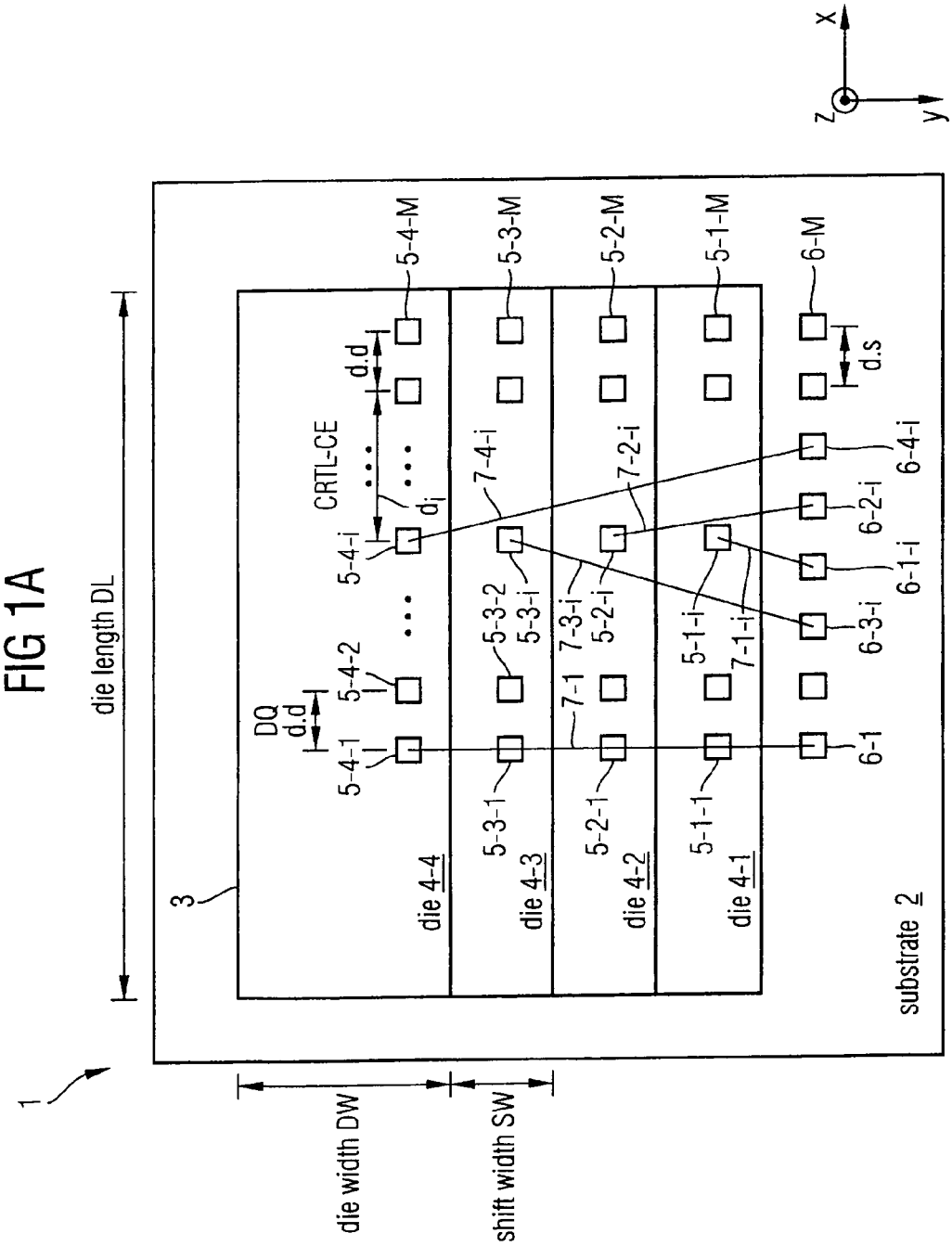

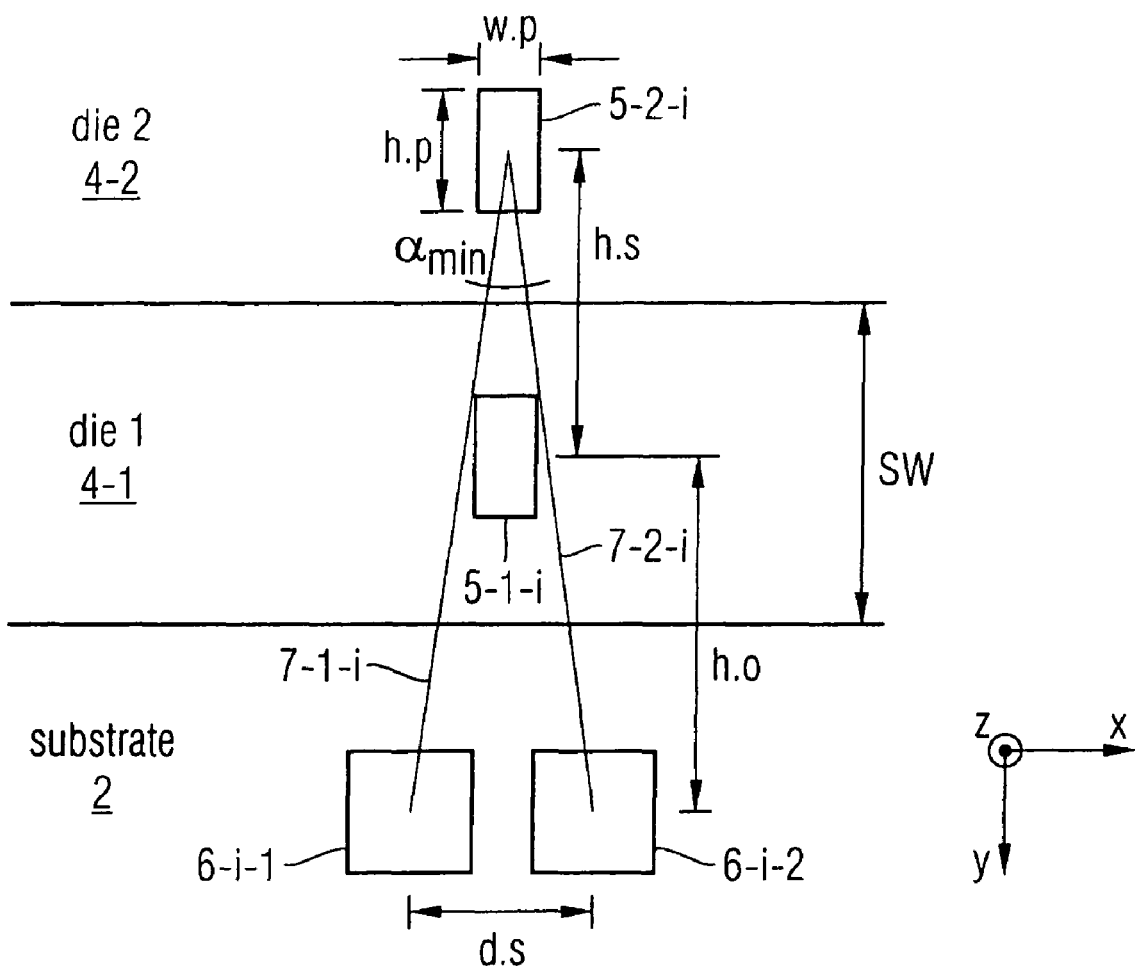

FIG 5
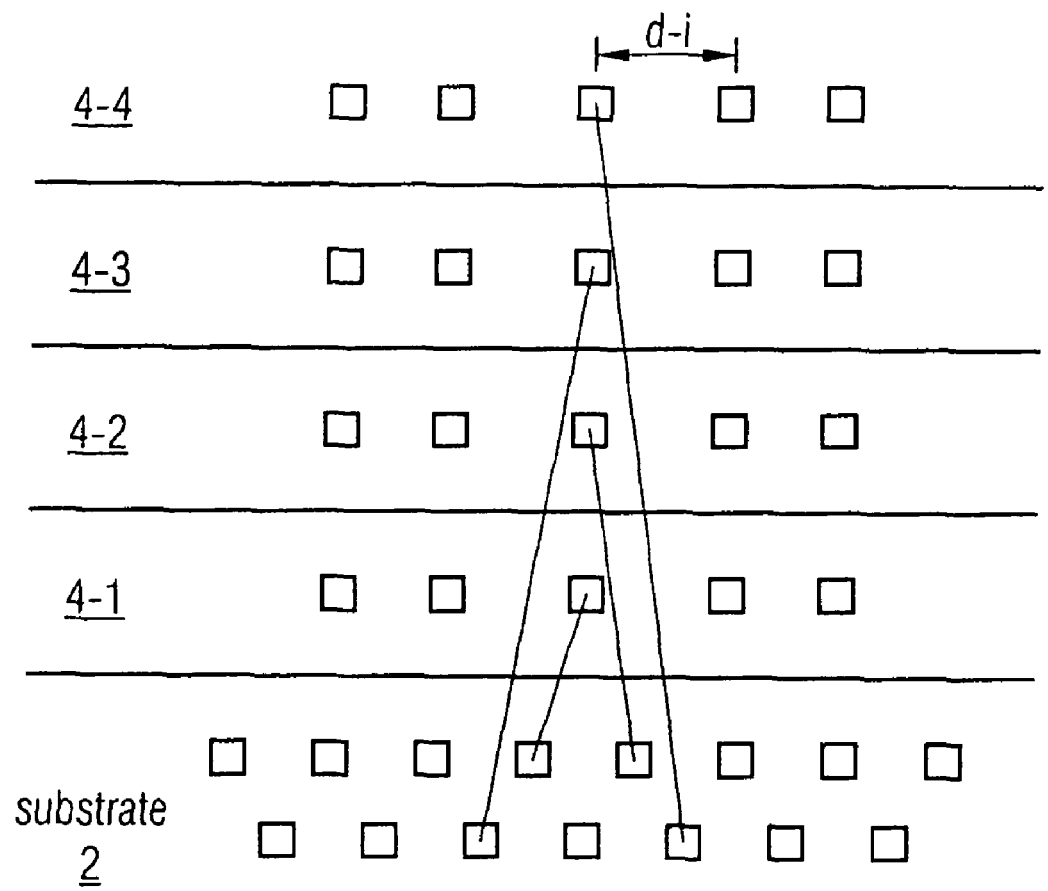
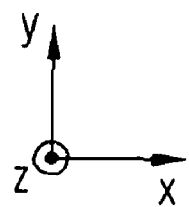

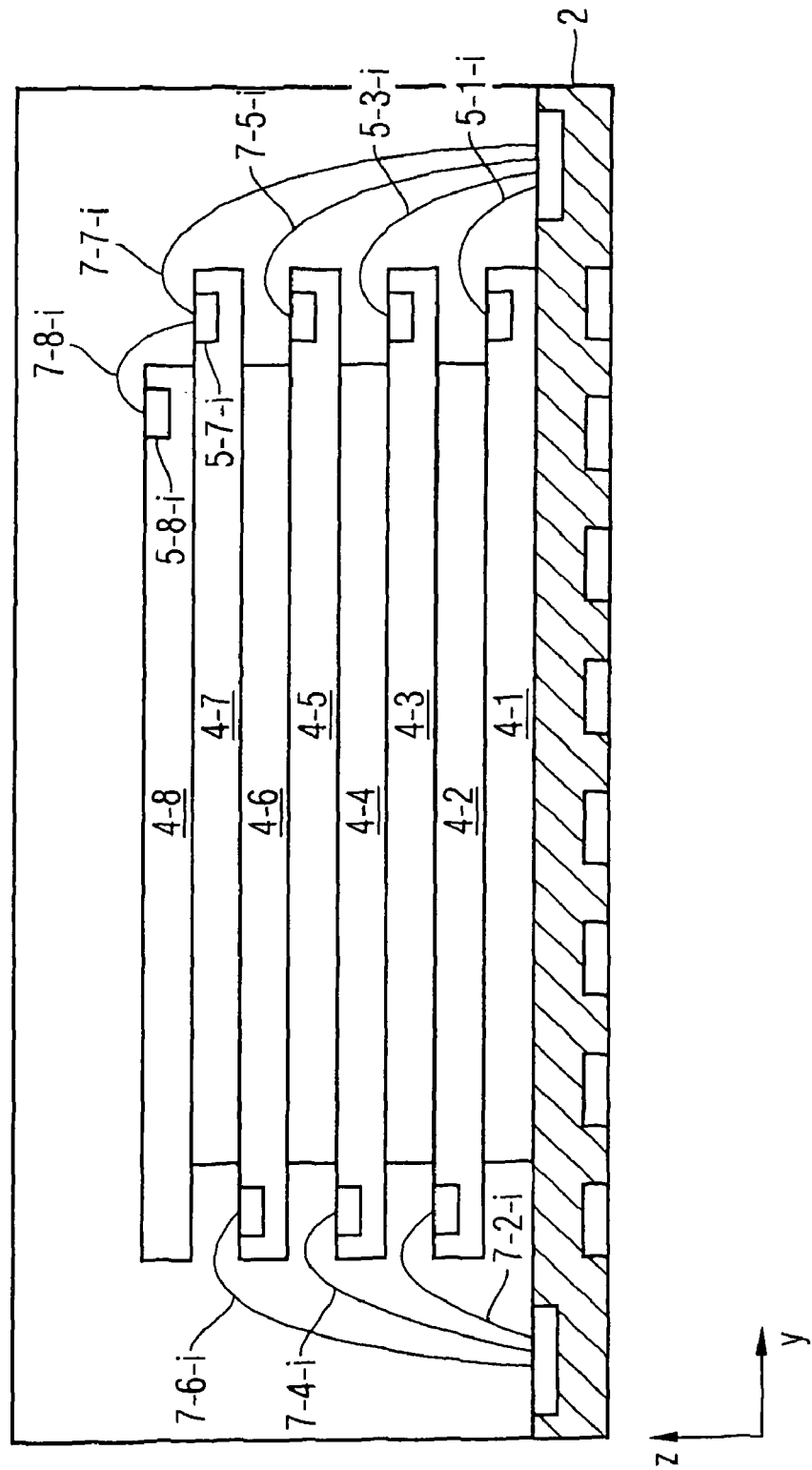

MEMORY DEVICE

BACKGROUND OF THE INVENTION

The invention relates to a memory device comprising at least one memory stack of stacked memory dies which are staggered with respect to each other.

In particular, the invention relates to a flash memory having at least one flash memory stack of stacked flash memory dies which are staggered with respect to each other.

The market demand for smaller, lighter and more powerful cell phones, PDAs and other electronic devices is driving the development of more compact electronic packages with increased functionality. To increase functionality and capacity of electronic devices memory dies are stacked upon each other. Each stack has two, three and four wire bonded dies which are typically arranged in a pyramid or in a stack of same-sized dies with overhanging designs. In this conventional approach, dies are stacked upon each other either with a spacer or with an inter-poser layer in between. Currently, dies having a thickness of around 100 µm are in production. In conventional memory die stacks, the number of dies which are stacked upon each other is restricted because of the constrains of the allowed package height. When stacking dies upon each other, the bonding of the die pads arranged on each die with corresponding pads on a substrate of the memory device becomes difficult and the wire bonding consumes more space with an increased number of dies stacked upon each other. The space consumption for wire bonding increases, in particular, if a pad or a die is bonded to different pads on the substrate. Furthermore, with the increased number of wire bonds, further a risk of visual and electrical shorts is increased.

SUMMARY OF THE INVENTION

The invention provides a memory device comprising at least one memory stack of stacked memory dies which are staggered with respect to each other, each stacked memory die of said memory stack comprising along its edge die pads for bonding said stacked memory die to substrate pads of said memory device connectable to a control circuit, wherein each die pad of a stacked memory die which connects said memory die individually to a substrate pad connectable to said control circuit comprises an increased distance in comparison to die pads of said stacked memory die which connect said stacked memory die in parallel with corresponding die pads of other stacked memory dies of said memory stack to corresponding substrate pads connectable to said control circuit.

In one embodiment of the memory device according to the present invention, a distance pattern of the die pads along the edge of a stacked memory die is identical for all stacked memory dies of the same memory stack.

In one embodiment of the memory device according to the present invention, the substrate pads provided on a substrate of said memory device are arranged in at least one row of substrate pads oriented substantially in parallel to an edge of the lowest stacked memory die of said memory stack or the substrate pads are arranged in a curved line to increase the respective pitches.

In one embodiment of the memory device according to the present invention, each stacked memory die comprises one pad edge area in which said die pads of said memory die are arranged.

In one embodiment of the memory device according to the present invention, the memory dies are stacked upon each other in an asymmetric staggered stair case arrangement.

In one embodiment of the memory device according to the present invention, the increased distance is given by:

$$d_i \geq \frac{N+1}{2} \cdot d_s,$$

wherein N is the number of stacked memory dies stacked upon each other in an asymmetric staggered stair case arrangement, and $d_s$ is a minimal pad distance of such pads provided on the substrate of said memory device.

In one embodiment of the memory device according to the present invention, the minimal pad distance $d_s$ of such pads provided on the substrate of said memory device is given by:

$$d_s = 2(h_s - h_0) \cdot \tan\frac{\alpha_{min}}{2},$$

wherein $h_s$ is a distance between two corresponding die pads of two staggered memory dies of said memory stack, $h_0$ is the distance between die pads of the lowest memory die of the memory stack and substrate pads provided on a substrate of said memory device, and $\alpha_{min}$ is a minimum angle avoiding that a bond wire crosses another die pad.

In one embodiment of the memory device according to the present invention, the minimum angle $\alpha_{min}$ is given by:

$$\alpha_{min} = 2\arctan\left[\frac{w_p}{2} \bigg/ \left(h_s - \frac{h_p}{2}\right)\right],$$

wherein $w_p$ is the width of a die pad, $h_p$ is the length of a die pad, and $h_s$ is the distance between two corresponding die pads of two staggered memory dies of said memory stack.

In one embodiment of the memory device according to the present invention, the memory dies are stacked upon each other in a symmetric staggered alternating arrangement.

In one embodiment of the memory device according to the present invention, the stacked memory dies are stacked alternating to each other, such that the pad edge areas of two memory dies which are stacked directly upon each other are oriented in opposing directions.

In one embodiment of the memory device according to the present invention, the memory dies are stacked upon each other to form a pyramid of stacked memory dies.

In one embodiment of the memory device according to the present invention, the stacked memory dies are attached to each other directly.

In one embodiment of the memory device according to the present invention, the stacked memory dies of said memory stack are glued to each other.

In one embodiment of the memory device according to the present invention, a spacer is provided between two stacked memory dies of said memory stack.

In one embodiment of the memory device according to the present invention, the at least one memory stack is molded in a package of said memory device.

In one embodiment of the memory device according to the present invention, the stacked memory dies are stacked flash memories.

In one embodiment of the memory device according to the present invention, a die pad of the stacked memory die which connects said memory device individually to said control circuit is provided for applying a chip enable signal to the stacked memory die.

In one embodiment of the memory device according to the present invention, the die pad of said stacked memory die which connects said memory die individually to said control circuit is provided for a read/busy signal.

In one embodiment of the memory device according to the present invention, a number of stacked memory dies of said memory stack is at least four.

In one embodiment of the memory device according to the present invention, a number of stacked memory dies of the memory stack is at least eight.

The invention further provides a flash memory comprising at least one flash memory stack of stacked flash memory dies which are staggered with respect to each other, each stacked flash memory die comprising along one of its edges die pads for bonding said stacked flash memory die to substrate pads arranged on a substrate of said flash memory stack for connecting said flash memory stack to a controller provided on said flash memory, wherein each die pad of a stacked flash memory die which is provided for connecting said stacked flash memory die individually to said controller comprises an increased distance in comparison to die pads of the stacked flash memory die which are provided each for connecting said stacked flash memory die in parallel with corresponding die pads of other stacked flash memory dies of said flash memory stack to said controller.

In one embodiment of the flash memory according to the present invention, the flash memory dies are stacked upon each other in an asymmetric staggered stair case arrangement.

In a further embodiment of the flash memory according to the present invention, the flash memory dies are stacked upon each other in a symmetric staggered alternating arrangement.

The invention further provides a memory device corresponding at least one memory stack of stacked memory dies which are stacked directly on each other and which are staggered with respect to each other in a symmetric alternating arrangement.

In one embodiment of the memory device according to the present invention, each stacked memory die comprises die pads which are arranged on an upper side of said stacked memory die in a pad edge area along an edge of said stacked memory die.

In one embodiment of the memory device according to the present invention, the stacked memory dies are staggered with respect to each other, such that the pad edge areas of all stacked memory dies form alternating protrusions of the symmetric memory stack.

In one embodiment of the memory device according to the present invention, the stacked memory dies are staggered alternating with respect to each other, such that the pad edge areas of two stacked memory dies which are stacked directly upon each other are oriented in opposite directions.

In one embodiment of the memory device according to the present invention, the highest stacked memory die and the memory die directly beneath the highest stacked memory die are stacked upon each other, such that the pad edge areas of both stacked memory dies are oriented in the same direction.

In one embodiment of the memory device according to the present invention, the die pads of the highest stacked memory die are bonded to the corresponding die pads of the memory die directly beneath the highest stacked memory die.

The invention further provides a flash memory comprising at least one memory stack of stacked flash memory dies which are stacked directly on each other and which are staggered with respect to each other in a symmetric alternating arrangement.

The invention further provides a method for manufacturing a memory stack comprising the steps of providing a memory die having die pads arranged on an upper side of said memory die in a pad edge area along an edge of said memory die, rotating a further memory die with respect to the previous memory die, such that the pad edge area of both memory dies are oriented in opposing directions and attaching the further memory die on the uppers side of the previous memory die in a staggered manner, such that the pad edge area of the underlying previous memory die remains uncovered, and repeating these steps until a predetermined number of memory dies are stacked upon each other.

In one embodiment of the method according to the present invention, the pads of the two highest stacked memory dies of the memory stack whose pad edge areas are both uncovered are bonded simultaneously in one wire bonding step to pads on a substrate.

In an embodiment of the method according to the present invention, the further memory die is rotated by 180° with respect to the previous memory die.

In a further embodiment of the method according to the present invention, the further memory die is rotated by 90° with respect to the previous memory die.

In one embodiment of the method according to the present invention, the memory dies are formed by flash memory dies.

In one embodiment of the method according to the present invention, at least four memory dies are stacked upon each other.

In a further embodiment of the method according to the present invention, at least eight memory dies are stacked upon each other.

In one embodiment of the method according to the present invention, the memory dies are glued to each other.

In one embodiment of the method according to the present invention, the stacked memory dies are molded in a package.

BRIEF DESCRIPTION OF THE DRAWINGS

FIGS. 1A, 1B, 1C show wire bonding patterns of embodiments of the memory device according to the present invention.

FIG. 2 shows a detailed view on a wire bonding pattern of an embodiment of the memory device according to the present invention.

FIG. 5 shows a wire bonding pattern according to an embodiment of the memory device according to the present invention.

FIG. 13 shows a cross section view through a memory device as an embodiment of the present invention.

DETAILED DESCRIPTION OF THE INVENTION

Figure 1B:
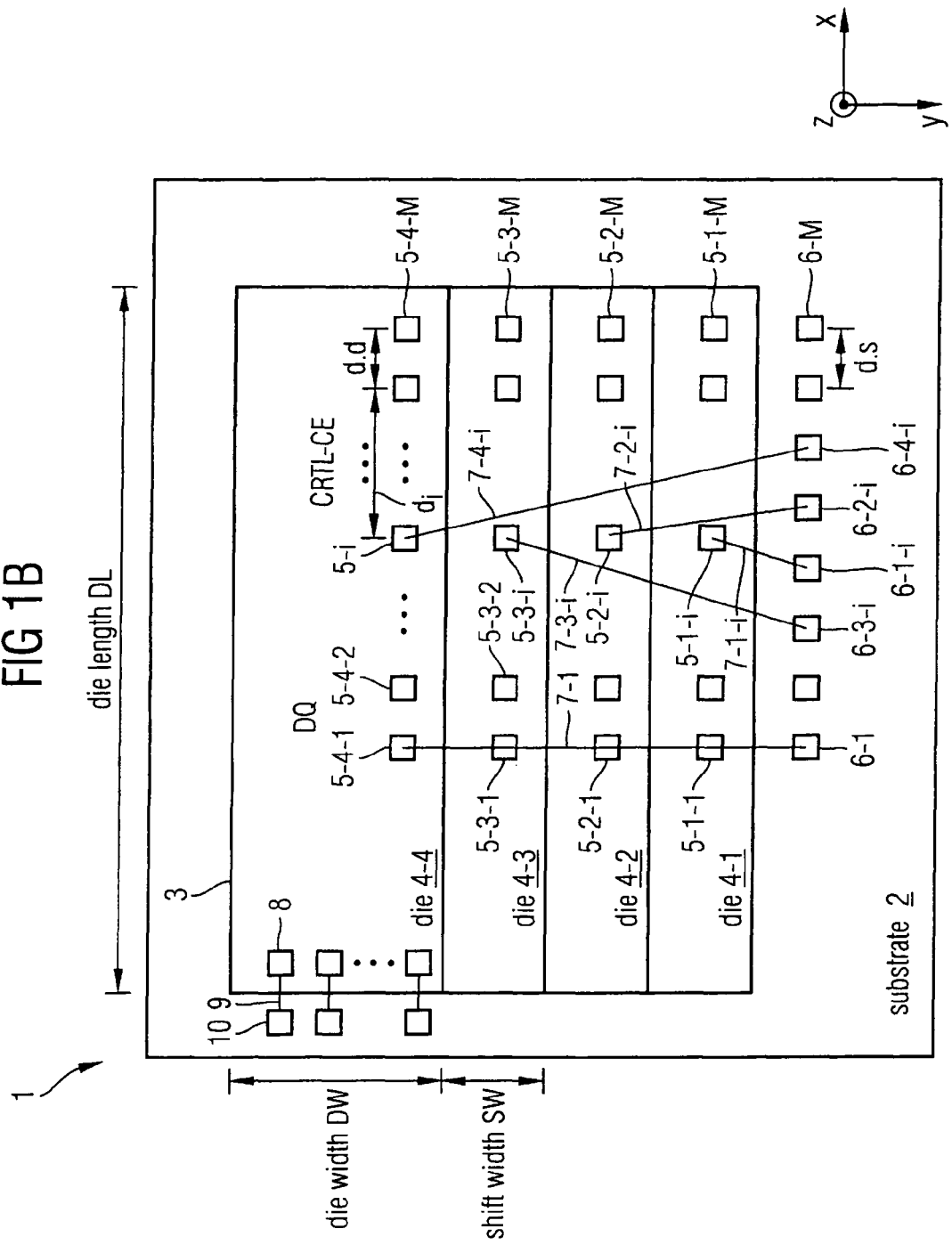

FIG. 1A shows a first possible embodiment of a memory device 1 according to the present invention schematically from above. The memory device 1 comprises a substrate 2 on which a memory stack 3 is arranged. The memory stack 3 comprises several stacked memory dies 4 which are stacked upon each other. In the embodiment shown in FIG. 1, four memory dies 4-1, 4-2, 4-3, 4-4 are stacked upon each other with memory die 4-1 forming the lowest memory die and memory die 4-4 forming the highest memory die of the memory stack 3. In the embodiment shown in FIG. 1A, the memory dies 4-1, 4-2, 4-3, 4-4 are stacked upon each other in an asymmetric staggered stair case arrangement similar to steps of a scale. The stacked memory dies 4-1, 4-2, 4-3, 4-4 are formed in one embodiment by stacked flash memories. Each stacked memory die 4 of the memory stack 3 comprises along its edge die pads 5 for bonding the stacked memory die 4 to substrate pads 6 on the substrate 2. As can be seen from FIG. 1A, a distance pattern of the die pads 5 along the edge of a stacked memory die 4 is identical for all stacked memory dies 4 of the memory stack 3. The die pads 6 can be connected to an external control circuit, such as a micro-controller writing data into the memory dies 4 or reading data from the memory dies 4. To read and to write data, the controller applies control signals to the memory device 1. The die pads 5 of each memory die 4-$i$ are connected to the corresponding substrate pads 6 on the substrate 2 by means of wire bonds 7 as shown in FIG. 1. Whereas the data signal lines and some control lines are connected to all memory dies 4 in parallel, some control signals of the controller have to be applied to the memory dies 4 within the memory stack 3 individually. These control signals are, for instance, a chip enable signals CE to enable each memory die 4 of the memory stack 3 individually. A further example for a control signal which controls each memory die 4 within the memory stack 3 individually is a read/busy RB signal. In the example as shown in FIG. 1A, a die pad 5-$j$-$i$ of each memory die 4-$j$ is provided for applying a chip enable signal CE to the respective memory die 4-$j$ and is connected via wire bonds 7-1-$i$, 7-2-$i$, 7-3-$i$, 7-4-$i$ to a group of substrate pads 6-1-$i$, 6-2-$i$, 6-3-$i$, 6-4-$i$ on the substrate 2 connected to the external controller. The number of substrate pads 6 within the group 6-$j$-$i$ corresponds to the number of memory dies 4-$j$ which are stacked upon each other to form the memory stack 3.

Figure 1C:
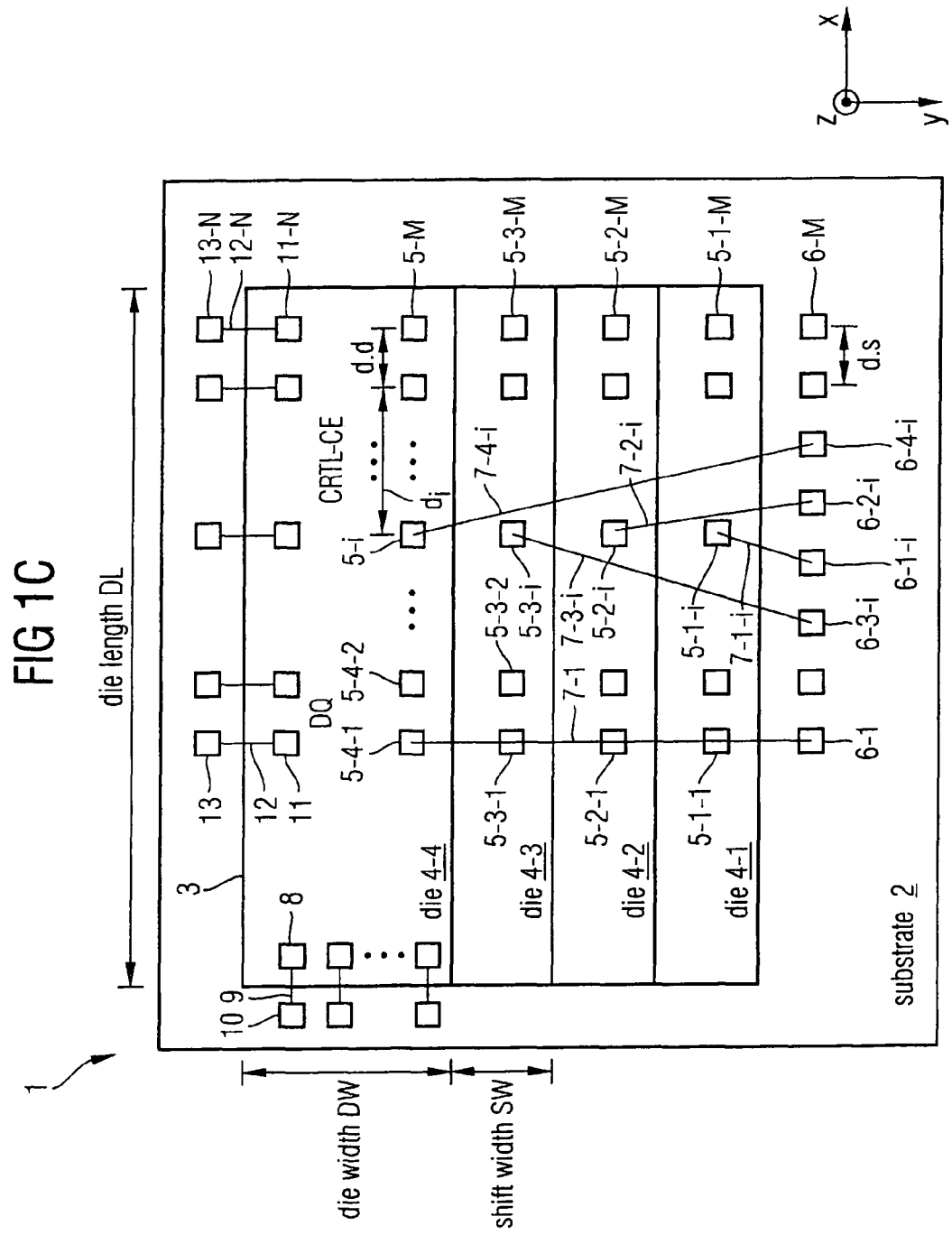

Each die pad 5-$j$-$i$ of a stacked memory die 4-$j$ which connects the memory die 4-$j$ individually to the controller via a substrate pad 6 comprises an increased distance $d_i$ to neighboring die pads on the stacked memory die 4-$j$ which connect the stacked memory die 4-$j$ in parallel with corresponding die pads 5 of other stacked memory dies 4 of the same memory stack 3 to the controller. In the memory device 1 as shown in FIG. 1A, the die pads 5-1-1, 5-2-1, 5-3-1, 5-4-1 of all memory dies 4-1, 4-2, 4-3, 4-4 are provided for reading data from the memory dies 4 or for writing data into the memory dies 4 and connect all stacked memory dies 4-1, 4-2, 4-3, 4-4 in parallel to an external logic, such as a controller via an common substrate pad 6-1. In contrast, each die pad 5-$i$ of the memory dies 4-1, 4-2, 4-3, 4-4 is connected individually to different substrate pads 6-1-$i$, 6-2-$i$, 6-3-$i$, 6-4-$i$ via wire bonds 7-1-$i$, 7-2-$i$, 7-3-$i$, 7-4-$i$ as can be seen from FIG. 1A. The wire bonds 7-1-$i$, 7-2-$i$, 7-3-$i$, 7-4-$i$ do not cross each other when seen from above to avoid visual shorts which make a visual quality check impossible and to avoid electrical short cuts. Furthermore, the wire bonds 7-1-$i$ to 7-4-$i$ do not overlap the die pads of other memory dies within the same memory stack 3. In the embodiment as shown in FIG. 1A, the substrate pads 6-1 to 6-N are provided on the substrate 2 of the memory device 1 and are arranged in one row of pads which are oriented in parallel to a longitudinal edge of the lowest stacked memory die 4-1 of the memory stack 3. In another embodiment, a number of rows of substrate pads 6-1 to 6-N can be higher than one, for instance, two or three rows of substrate pads 6. As can be seen from FIG. 1A, all memory dies 4-1, 4-2, 4-3, 4-4 which are stacked upon each other in the same memory stack 3 comprise the same die lengths DL and the same die width DW. Each memory die 4-$j$ comprises along one of its edges die pads 5-$j$-1 to 5-$j$-M for bonding the stacked memory die 4-$j$ to the substrate pads 6 of the memory device 1. The die pads 5 are located in a pad edge area determined by a shift width SW and the die length DL. In the embodiment of the memory device 1 shown in FIGS. 1A to 1C, the memory dies 4-$j$ are stacked upon each other in an asymmetric staggered stair case arrangement. In the embodiment as shown in FIGS. 1A to 1C, four memory dies 4-1 to 4-4 are stacked upon each other. In other embodiments of the memory device 1 according to the present invention more memory dies 4-$j$ are stacked upon each other, for instance, five, six, seven, eight and more memory dies 4-$j$. The increased distance $d_i$ of die pads 5 which are connected individually to substrate pads 6 to neighboring die pads 5 which are connected in parallel to corresponding substrate pads 6 simplifies the wire bonding and helps to avoid visual and electrical short cuts. The design of the memory dies 4 is adapted to an application of the respective memory dies 4. The pad layout of the memory die 4-$j$ is adapted to an application in a multi-chip package or a system in package wherein the system layout is considered in the memory die design.

In the embodiment as shown in FIG. 1A, a distance $d_s$ between two substrate pads 6 on the substrate 2 is equal, i.e. all substrate pads 6 are located in one row in an equidistant substrate pad pattern. In other embodiments the distance $d_s$ between two substrate pads 6 is not constant but varies. In the embodiment shown in FIG. 1, the distance $d_d$ between two die pads 5 which connect a stacked memory die 4 in parallel with corresponding die pads 5 of other stacked memory dies 4 of the same memory stack 3 via a substrate pad 6 to an external controller, such as a data pad DQ 5-*j*-1 is constant, i.e. equidistant, wherein the distance $d_d$ corresponds in one embodiment to the distance $d_s$ between two corresponding substrate pads 6 on the substrate 2. In other embodiments the distance $d_d$ between two chip pads is not constant, i.e. not equidistant.

In the embodiment shown in FIG. 1A, the die pads 5 are located in one row parallel to an edge of the corresponding memory die 4-*j*. In one possible embodiment, the highest memory die 4-4 further comprises die pads 8 on the front and rear side connecting this memory die 4-4 to corresponding substrate pads 6 on the substrate 2 which are also located on the front and rear side. In the embodiment shown in FIG. 1B, the highest memory die 4-4 comprises die pads 8 which are connected via wire bonds 9 to substrate pads 10 on a lateral side of the memory stack 3.

In the embodiment shown in FIG. 1A, all memory dies 4-1 to 4-4 are formed by the same memory dies, i.e. the circuitry integrated in each memory die 4 is identical. In other embodiments, the memory dies 4 comprise different integrated circuitry.

In an embodiment of the memory device 1, the highest memory die 4-4 as shown in FIG. 1B comprises a more complex circuitry than the other memory dies 4-1 to 4-3, because it is possible to provide additional die pads 8 on the front and rear side of this highest stacked memory die 4-4.

In a still further embodiment as shown in FIG. 1C, it is also possible to provide die pads 11 on the rear side of the highest stacked memory die 4-4. The die pads 11 on the rear side are connected via wire bonds 12 to substrate pads 13 provided on the substrate 2.

In the embodiments shown in FIGS. 1A, 1B, 1C the minimal possible pad distance on a memory die 4, i.e. the die pad distance $d_d$ is equal to the pad distance $d_s$ of the substrate pads 6.

In other embodiments, it is possible to provide a minimal possible pad distance $d_d$ on the memory die 4-*i* which is lower than the pad distance on the substrate $d_s$, because it is possible to generate finer structures on silicon than on substrates.

In the embodiments shown in FIGS. 1A, 1B, 1C each memory device 1 comprises one memory stack 3 having several memory dies 4-1 to 4-4 which are stacked upon each other in a staggered manner.

In other embodiments, the memory device 1 comprises more than one memory stack 3, for example, two, three or four memory stacks 3 each having several memory dies 4-4 stacked upon each other. The stacked memory dies 4 are molded in one or separate packages.

In further embodiments, it is possible to stack several packages of memory stacks 3 upon each other.

During manufacturing of the memory stacks 3 as shown in FIGS. 1A to 1C wire bonding between the substrate pads 6 and the die pads 5 is performed in a sequence beginning with the lowest memory die 4-1 and ending with the highest memory die 4-4. Accordingly, first, the wire bonding connections 7-1-*i*, 7-2-1 then the wire bond connection 7-3-*i*, and finally the wire bond 7-4-*i* is formed.

As can be seen from the embodiments shown in FIGS. 1A, 1B, 1C, each die pad 5-*j*-*i* of a stacked memory die 4-*j* which connects the memory die 4-*i* individually to substrate pads 6-*j*-*i* comprises an increased distance $d_i$ to neighboring die pads 5 of the stacked memory die 4 which connect the stacked memory die 4-*j* in parallel with corresponding pads 5 of other stacked memory dies 4. The increased distance $d_i$ depends on the number N of memory dies 4 which are stacked upon each other. In the embodiments shown in FIGS. 1A, 1B, 1C, the number N of memory dies 4 which are stacked upon each other is four (N=4).

The increased distance $d_i$ is given by:

$$d_i \geq \frac{N+1}{2} \cdot d_s,$$

wherein N is the number of stacked memory dies 4-*j* stacked upon each other in an asymmetric staggered stair case arrangement as shown in FIGS. 1A, 1B, 1C, and $d_s$ is a minimal pad distance of substrate pads 6 provided on the substrate 2 of the memory device 1.

As can be seen from FIG. 2, the minimal pad distance $d_s$ of substrate pads 6 is given by:

$$d_s = 2(h_s - h_0) \cdot \tan\frac{\alpha_{min}}{2},$$

wherein $h_s$ is a distance between two corresponding die pads 5-*i* of two staggered memory dies 4-*j* of the same memory stack 3, $h_0$ is a distance between die pads 5-1-*i* of the lowest memory die 4-1 of the memory stack 3, and corresponding substrate pads 6 provided on the substrate 2 of the memory device 1, and $\alpha_{min}$ is a minimum angle avoiding that a bond wire 7-*i* crosses a die pad 5.

The minimum angle $\alpha_{min}$ as shown in FIG. 2 depends on the size of a die pad 5 and is given by:

$$\alpha_{min} = 2\arctan\left[\frac{w_p}{2} \bigg/ \left(h_s - \frac{h_p}{2}\right)\right],$$

wherein $w_p$ is the width of a die pad 5, $h_p$ is the length of a die pad 5, and $h_s$ is the distance between two corresponding die pads 5 of two staggered memory dies 4-*j*, 4-(*j*+1) of said memory stack 3.

The wire bonds 7 are connected in a preferred embodiment to the center of corresponding bond pads 5, 6.

Figure 3A:
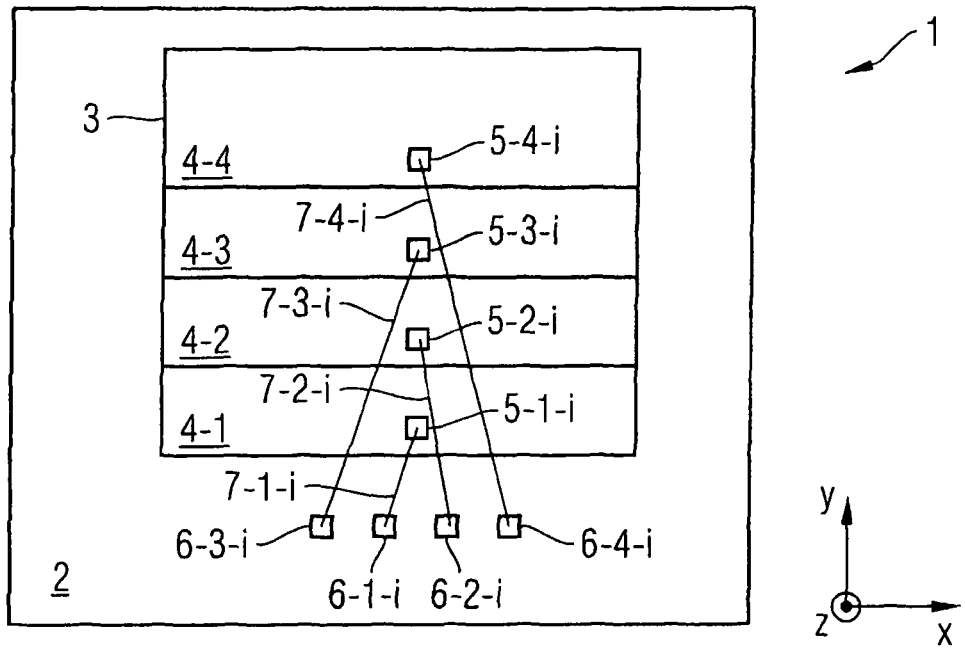
FIGS. 3A, 3B show alternatives for a wire bonding pattern according to embodiments of the memory device according to the present invention.
Figure 3B:
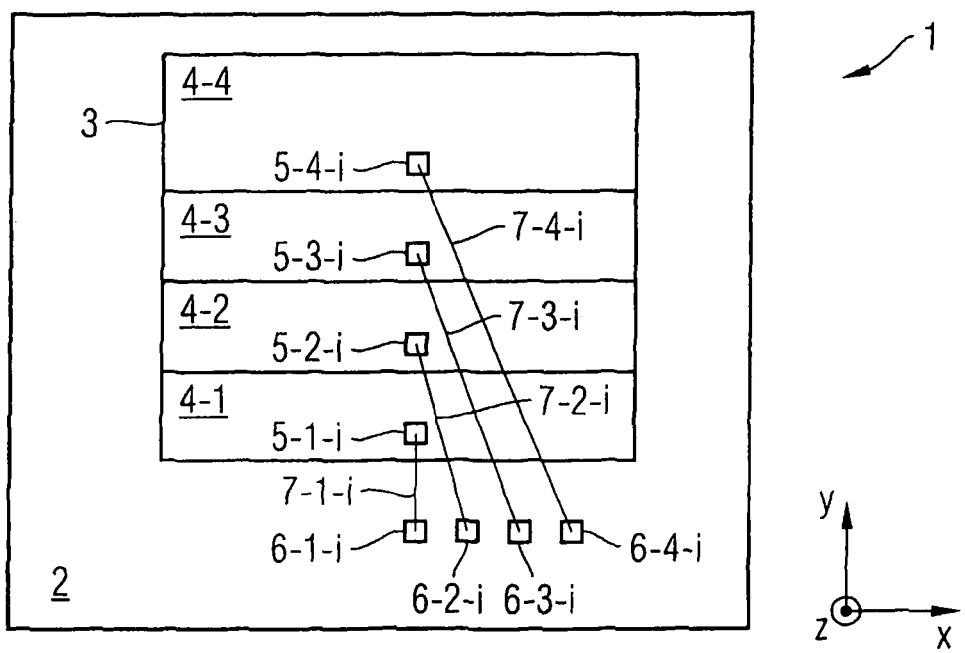

FIGS. 3A, 3B show different embodiments for connecting the die pads 5 of stacked memory dies 4 of the same memory stack 3 individually to corresponding substrate pads 6 on the substrate 2. The wire bonding is performed in a preferred embodiment beginning with the lowest memory die 4-1 and ending with the highest memory die 4-4. Accordingly, in both embodiments, as shown in FIGS. 3A, 3B the wire bonds are formed in the following sequence, i.e. 7-1-*i*, 7-2-*i*, 7-3-*i*, 7-4-*i*.

In the embodiment shown in FIG. 3A, the wire bonding is performed in an alternating manner and the substrate pads 6-1-*i* to 6-4-*i* are spread out on both sides of the corresponding die pads 5 of the stacked memory dies 4.

In the wire bonding pattern as shown in FIG. 3B, the substrate pads 6-1-*i* to 6-4-*i* are spread out to one side of the corresponding die pads 5 on the stacked memory dies 4 and are bonded sequentially from left to right starting with wire bonds 7-1-$i$ and stopping with the last wire bond 7-4-$i$ connecting the highest memory die 4-4 with the pad 6-4-$i$ on the substrate 2.

Figure 4:
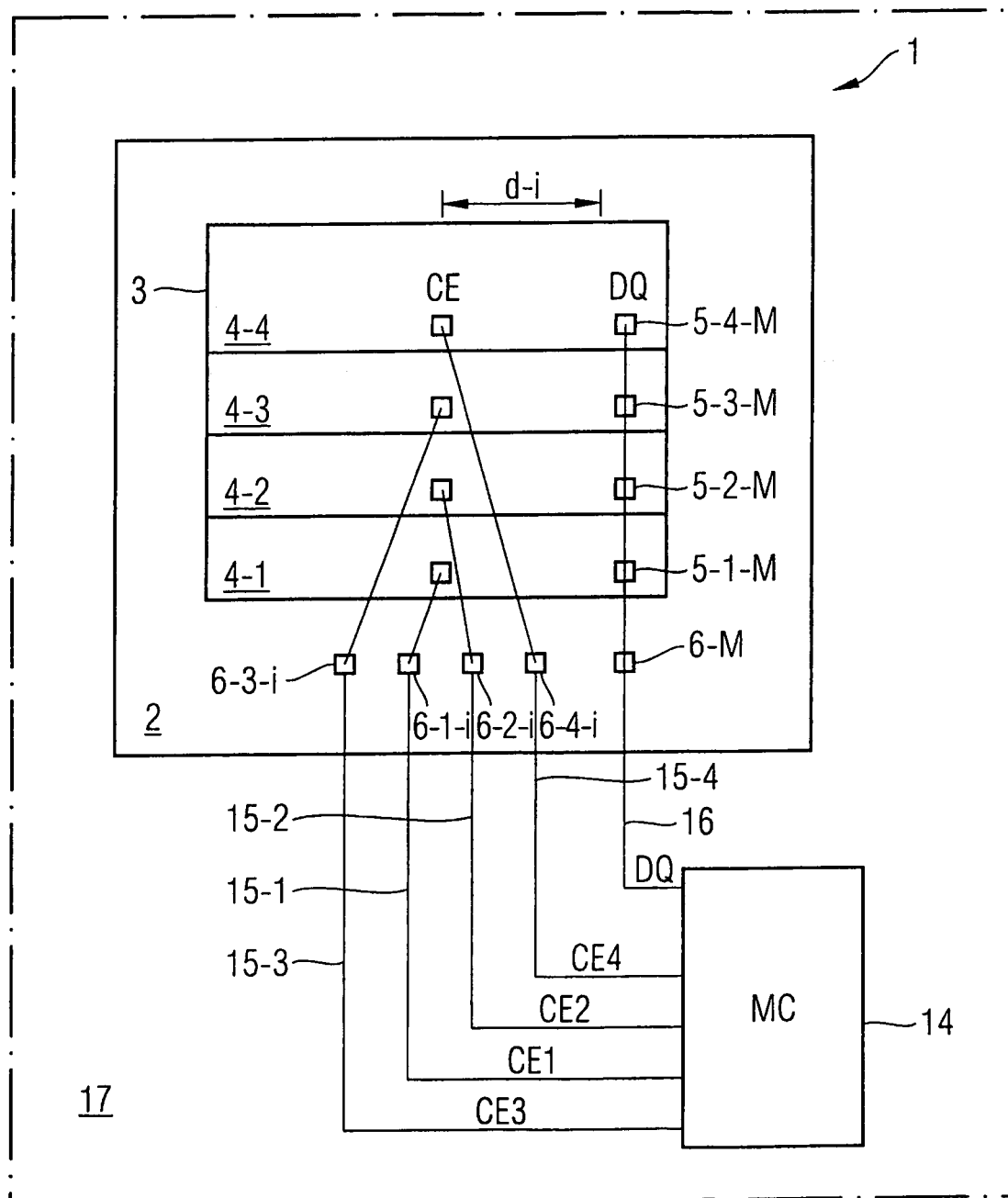
FIG. 4 shows schematically the connection of a memory device according to an embodiment of the present invention to a micro-controller.

FIG. 4 shows the connection of a memory device 1 according to an embodiment the present invention to a control circuit 14 which can be formed by a micro-controller. In the given example, the micro-controller applies four chip enable signals CE1 to CE4 via four control lines 15 and substrate pads 6 to four stacked memory dies 4-1 to 4-4 of a memory stack 3 of the memory device 1. Further, the micro-controller 14 is connected via at least one data line 16 to a corresponding substrate pad 6-M to which all stacked memory dies 4-1 to 4-4 are connected in parallel.

In an possible embodiment as shown in FIG. 4, the micro-controller 14 is arranged on a memory circuit board 17 on which the memory device 1 according to the present invention is mounted.

The memory circuit board 17 can comprise several memory devices 1 according to the present invention. In one embodiment, the memory devices 1 are arranged on the front and on the rear side of the memory circuit board 17. In one embodiment, several memory devices 1 according to the present invention each having several stacked memory dies 4 are mounted upon each other on the memory circuit board 17.

FIG. 5 shows a further embodiment of the memory device 1 according to the present invention. In the embodiment as shown in FIG. 5, more than one row of substrate pads 6 is provided. As shown in FIG. 5, the substrate pads 6 are arranged in two rows parallel to the edge of the lowest memory die 4-1. In this embodiment, the increased distance $d_i$ of die pads 5 which individually connect a stacked memory die 4 to the controller 14 to neighboring die pads 5 of the stacked memory die 4 which connect the stacked memory die 4 in parallel with corresponding die pads 5 of other stacked memory dies 4 of the same memory stack 3 can be reduced by staggering the substrate pads 6 on the substrate 2 without visual or electrical short cuts of the wire bonds 7.

Figure 6:
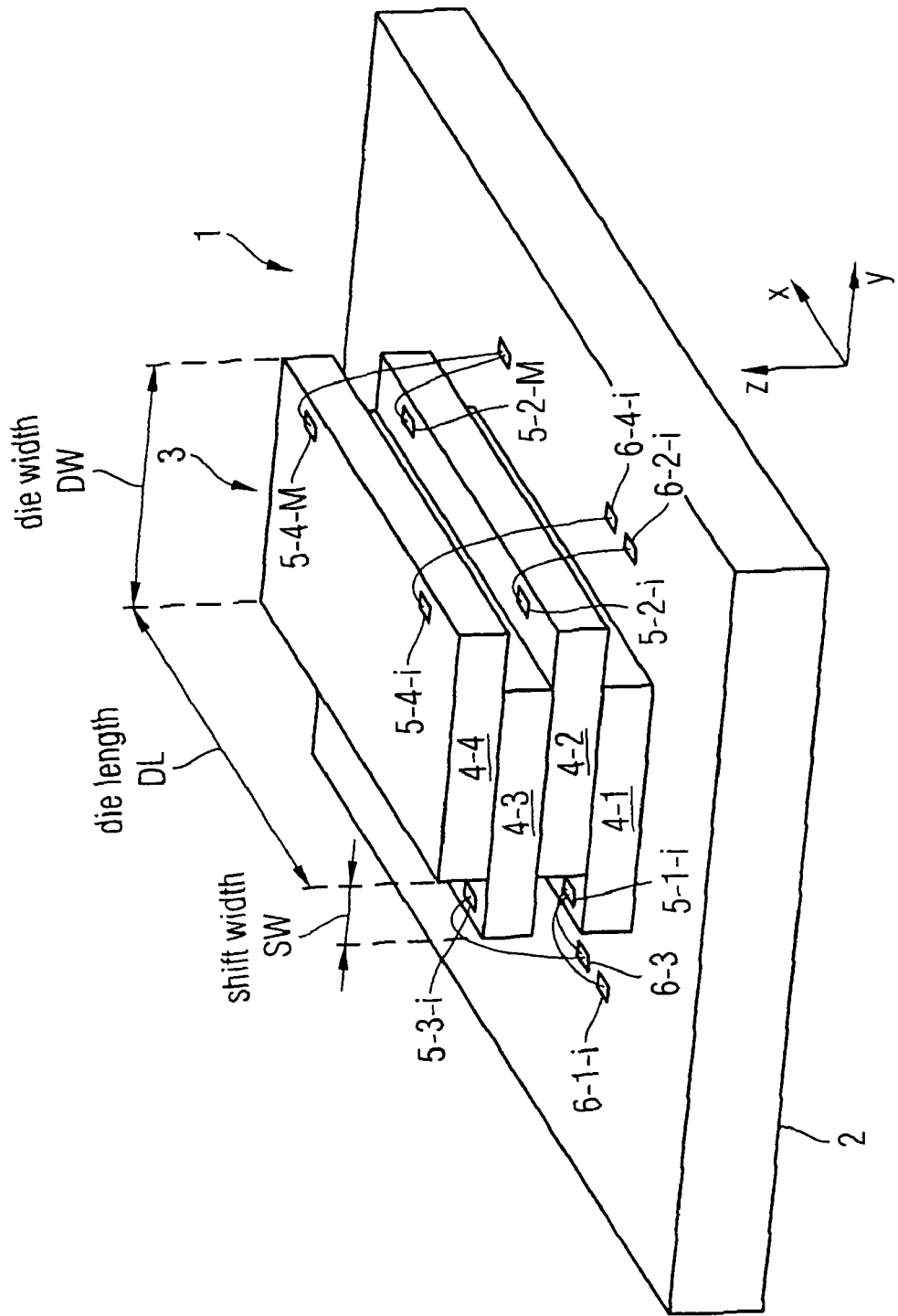
FIG. 6 shows a perspective view to illustrate wire bonding according to an embodiment of the memory device according to the present invention.

FIG. 6 shows a further embodiment of the memory device 1 according to the present invention. In the embodiment shown in FIG. 6, the memory dies 4-1, 4-2, 4-3, 4-4 are stacked upon each other in a symmetric staggered alternating arrangement. As can be seen from FIG. 6, the memory dies 4 are stacked alternating to each other, such that pad edge areas of two memory dies 4 which are stacked directly upon each other are oriented in opposing directions. Each die pad 5 of a stacked memory die 4 which connects the respective memory die 4 individually to the controller 14 comprises an increased distance $d_i$ to neighboring die pads 5 which connect the stacked memory die 4 in parallel with corresponding die pads 5 of other stacked memory dies 4 of the same memory stack 3 to the controller 14. In the embodiment shown in FIG. 6, substrate pads 6 are located on both longitudinal sides of the memory stack 3 for connecting the die pads 5 located on the respective protruding pad edge areas. In the embodiment shown in FIG. 6, four memory dies 4-1 to 4-4 are stacked upon each other. In an alternative embodiment, eight memory dies 4-1 to 4-8 are stacked upon each other in a symmetric staggered alternating arrangement.

Figure 7:
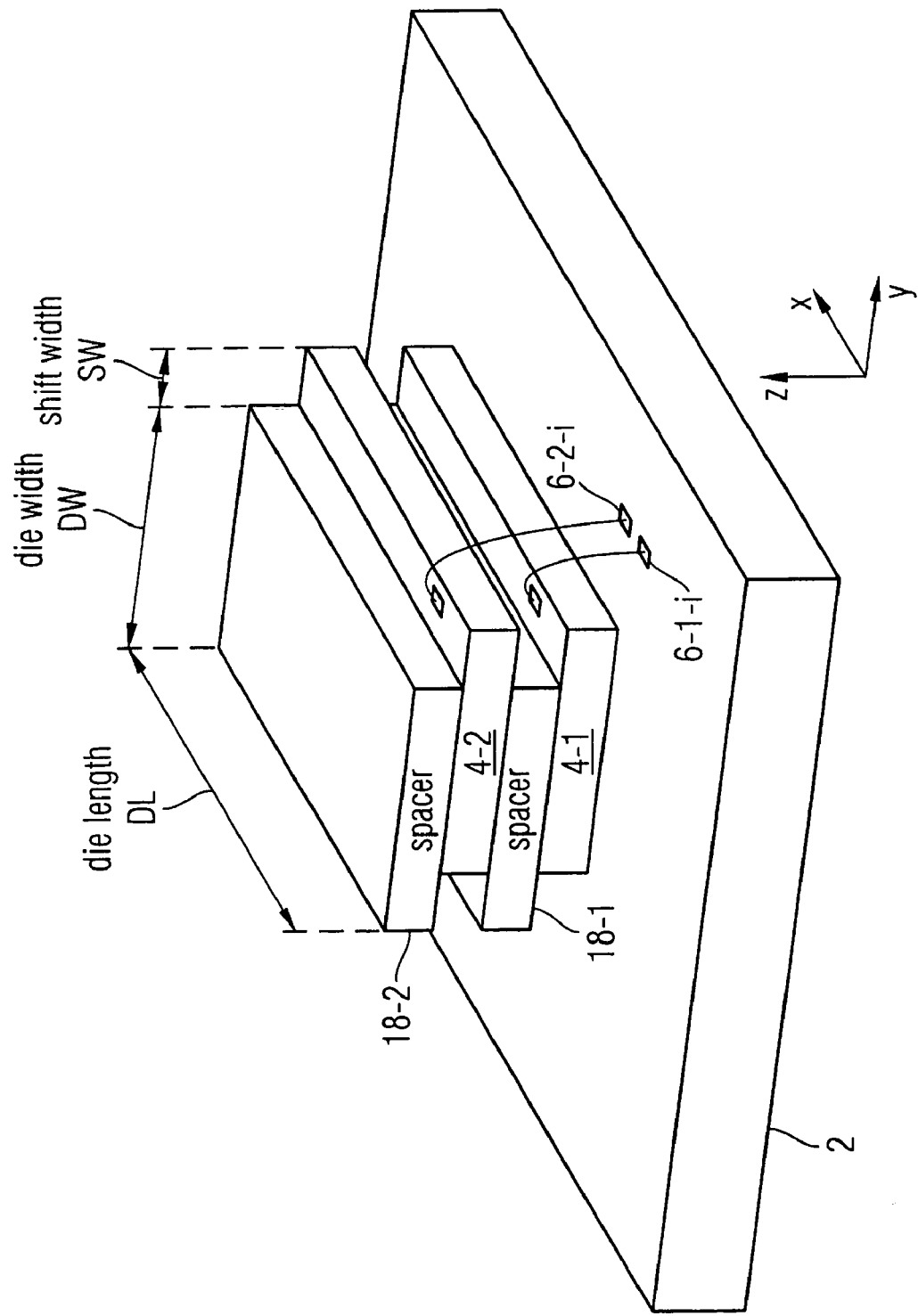
FIG. 7 shows a perspective view to illustrate wire bonding as an embodiment of the memory device according to the present invention.

FIG. 7 shows a symmetric staggered alternating arrangement wherein spacers 18 are provided between stacked memory dies 4.

Figure 8:
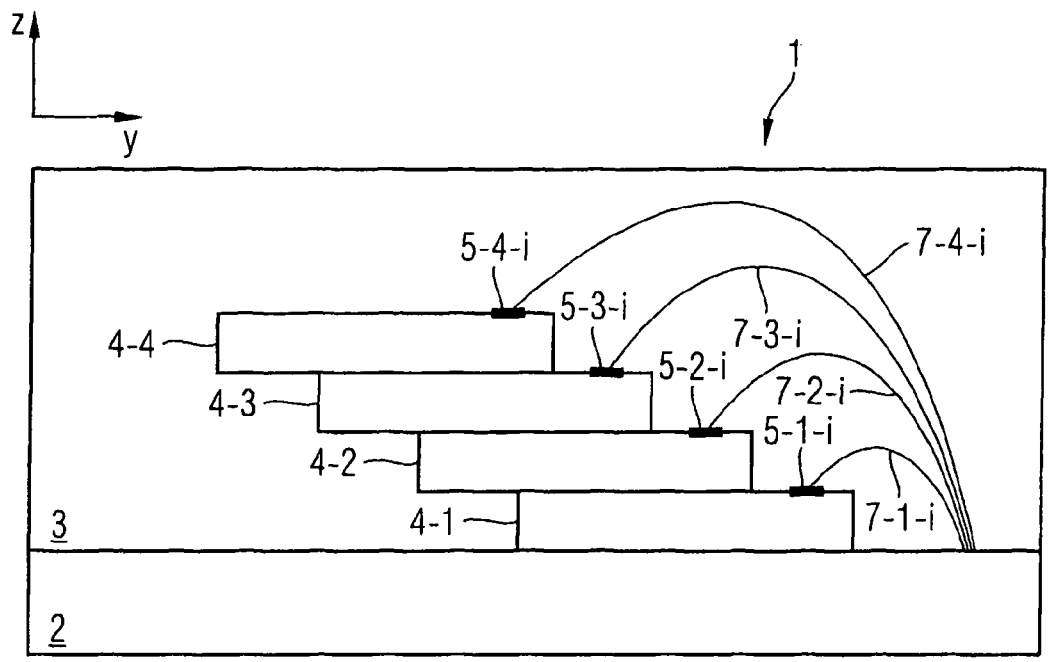
FIG. 8 shows a cross section view through a memory device as an embodiment of the present invention.

FIG. 8 shows a cross section view through a memory stack 3 of a memory device 1 according to an embodiment of the present invention as shown in FIG. 1A. As can be seen from FIG. 8, each die pad 5-$j$-$i$ connects the corresponding memory die 4-$j$ individually to substrate pads 6 on the substrate 2.

Figure 9:
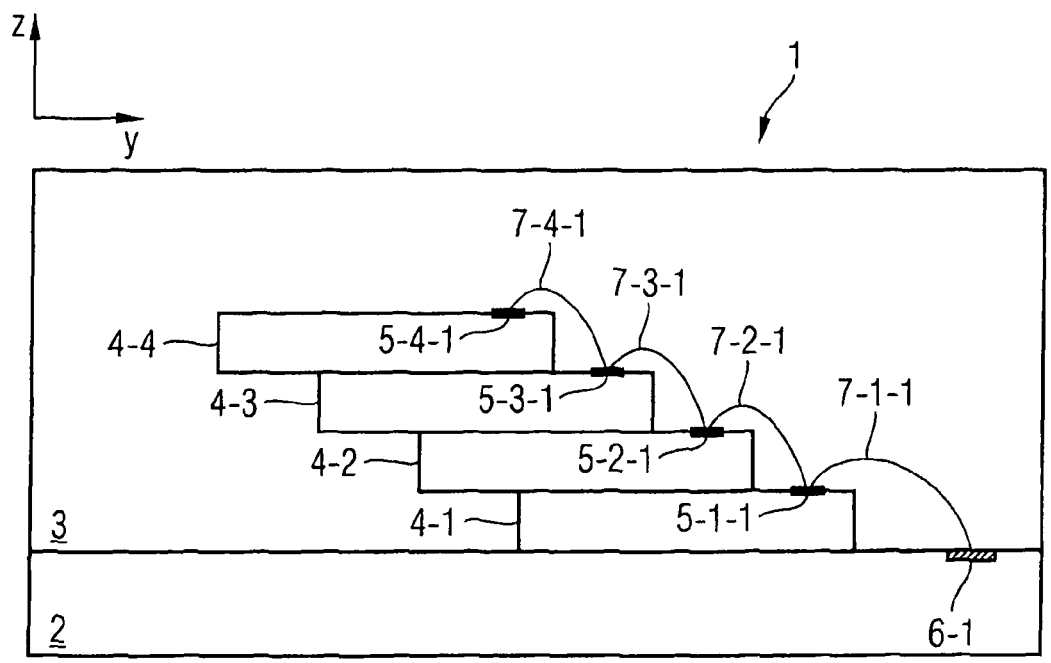
FIG. 9 shows a cross section view through a memory device as an embodiment of the present invention.

FIG. 9 shows a further cross section through a memory stack 3 of the memory device 1 according to the present invention. In this embodiment, the wire bonds for data lines are connected in a cascade to the corresponding substrate pad 6 on the substrate 2. In an alternative embodiment, the die pads 5 which connect the stacked memory dies 4 in parallel with corresponding die pads 5 of other stacked memory dies 4 of the same memory stack 3 are connected via separate wire bonds 7 to the corresponding substrate pad 6.

Figure 10:
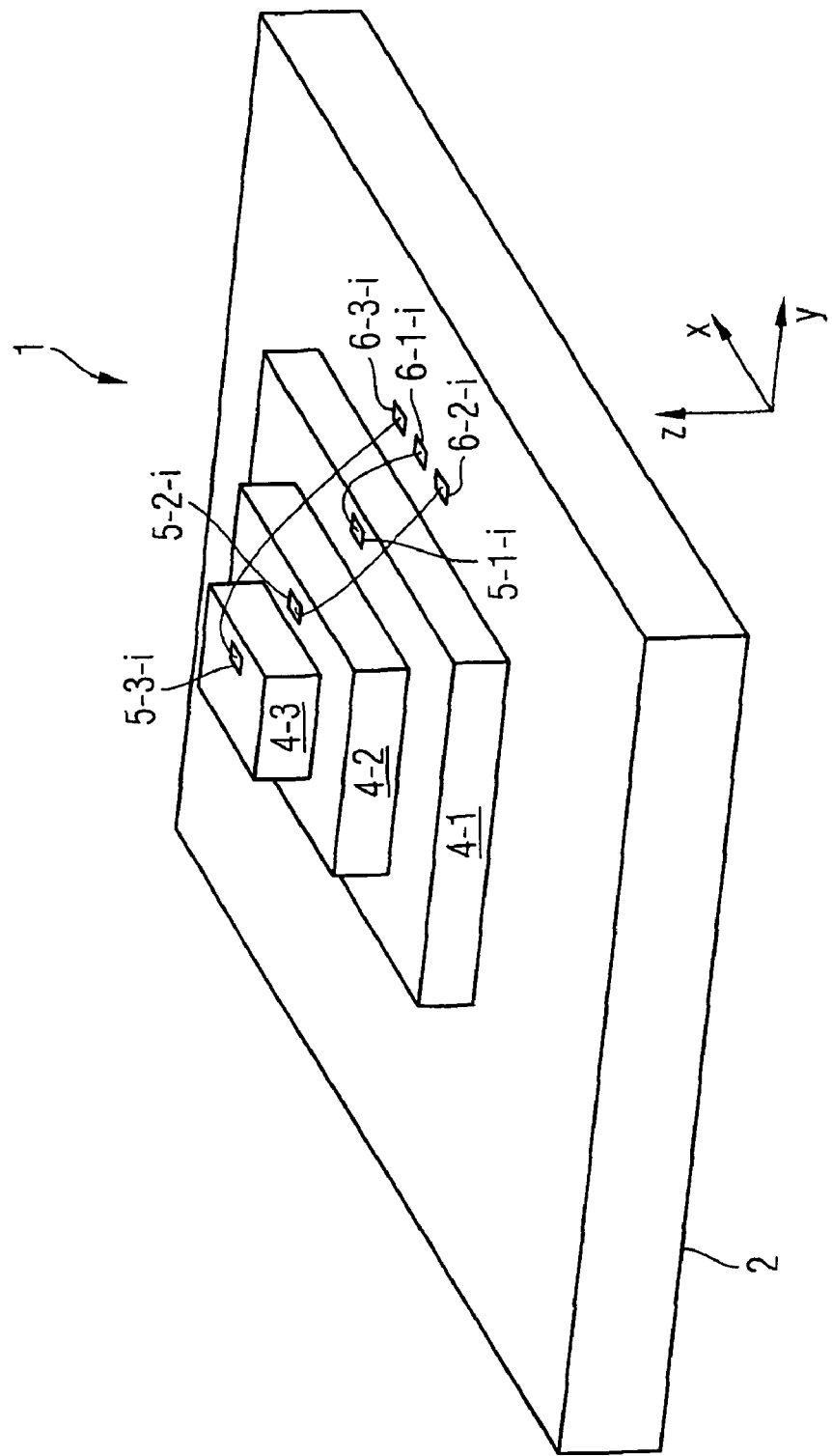
FIG. 10 shows a perspective view on a memory device as an embodiment of the present invention.

FIG. 10 shows a further embodiment of the memory device 1 according to the present invention. In the embodiment shown in FIG. 10, the memory dies 4-1, 4-2, 4-3 are stacked upon each other to form a pyramid of stacked memory dies 4. In the embodiment shown in FIG. 10, the memory dies 4-$j$ have a different size. Further, the circuitry integrated in each memory die 4-$j$ can be different.

Figure 11:
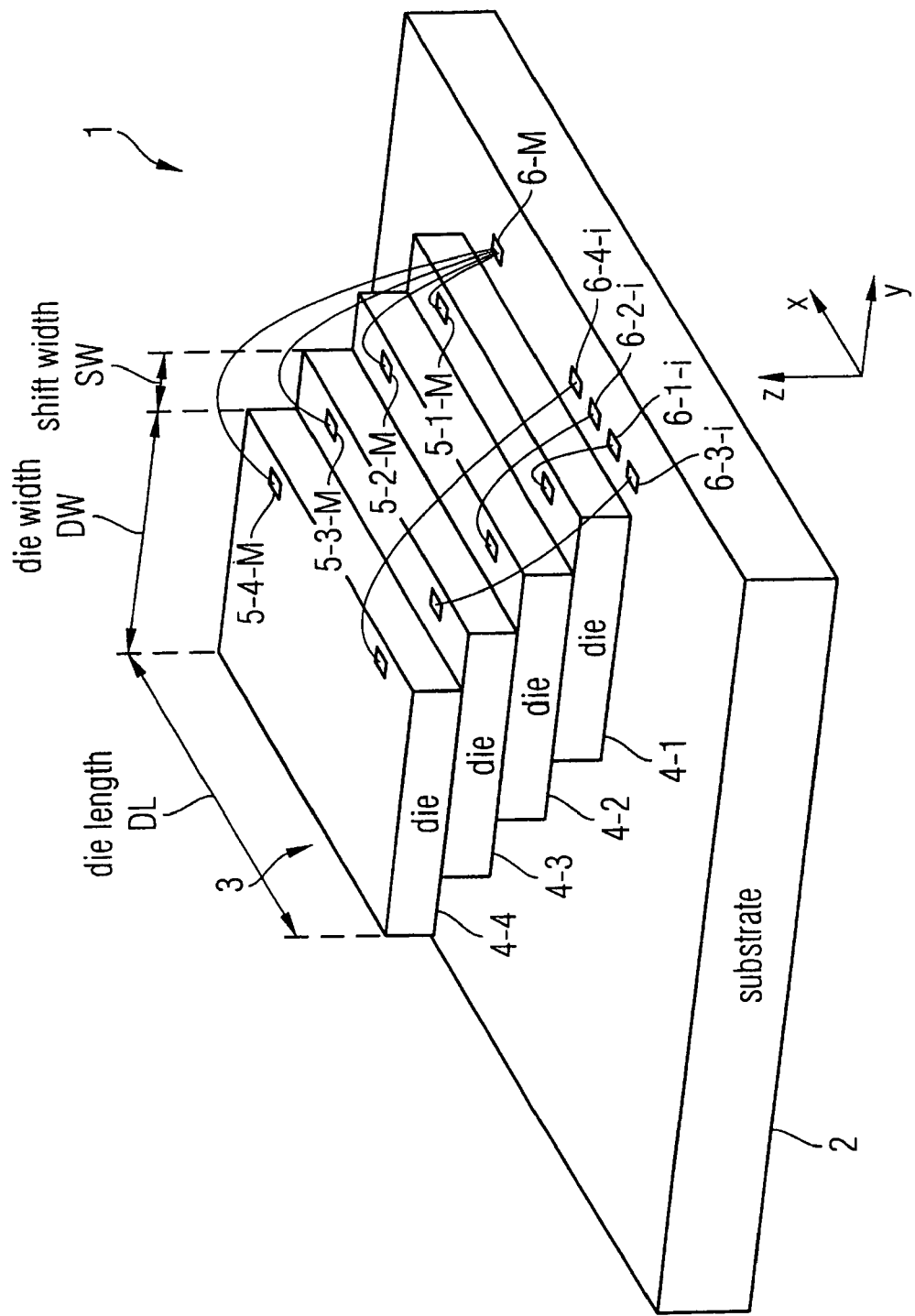
FIG. 11 shows a perspective view on a memory device as an embodiment of the present invention.

FIG. 11 shows a perspective view of an embodiment of the memory device 1 according to the present invention as shown in FIG. 1A. In the embodiment shown in FIG. 11, the memory dies 4 are stacked upon each other in an asymmetric staggered stair case arrangement like steps of a scale, whereas in the embodiment as shown in FIG. 6, the memory dies 4 are stacked upon each other in a symmetric staggered alternating arrangement. In the embodiment of the memory device 1 according to the present invention as shown in FIGS. 6, 11, the memory dies 4-1, 4-2, 4-3, 4-4 are attached to each other directly. In one embodiment of the memory device 1 according to the present invention, the stacked memory dies 4-1, 4-2, 4-3, 4-4 are glued to each other. In an alternative embodiment of the memory device 1 according to the present invention, a spacer 18 is provided between two stacked memory dies 4 of the memory stack 3. The memory stack 3 as shown in FIGS. 6, 11 is molded in a package of the memory device 1, i.e. the memory stack 3 is integrated in a molding compound. With the arrangement according to the present invention, it is avoided that the wire bonds 7 cross each other and the die pads 5 at a low distance so that during molding it is secured that a sweeping of the wires 7 cannot create electrical shorts.

Figure 12:
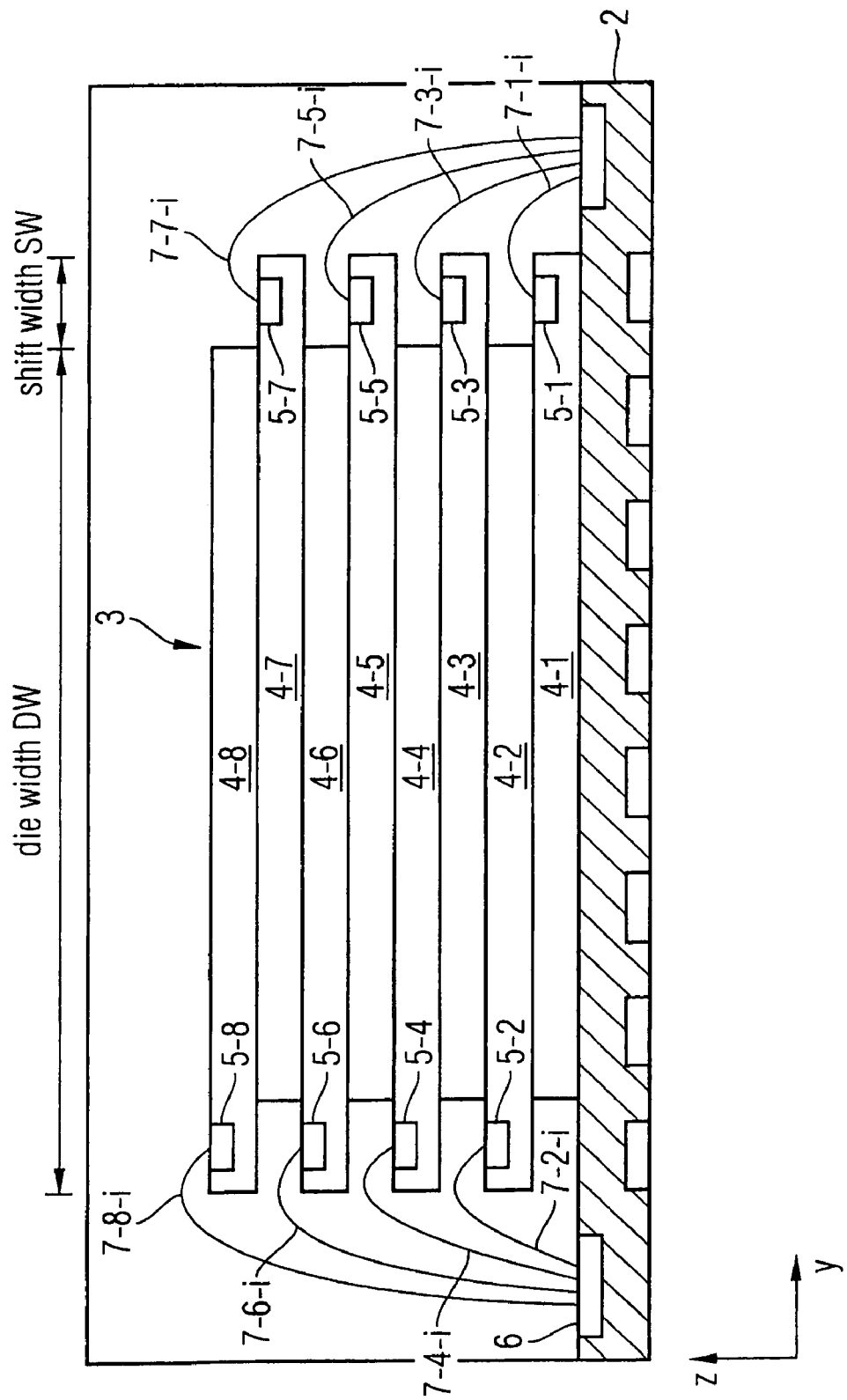
FIG. 12 shows a cross section view through a memory device as an embodiment of the present invention.

FIG. 12 shows a further embodiment of the memory device 1 according to the present invention. In the embodiment shown in FIG. 12, eight memory dies 4-1 to 4-8 are stacked upon each other in a symmetric staggered alternating arrangement. The stacked memory dies 4 are stacked directly on each other and are staggered with respect to each other in a symmetric alternating arrangement, wherein each stacked memory die 4 comprises die pads 5 which are arranged on the upper side of each stacked memory die 4 in a pad edge area along an edge of this stacked memory die 4. The stacked memory dies 4 are staggered with respect to each other, such that the pad edge areas of all stacked memory dies 4 form alternating protrusions of the memory stack 3 as shown in FIG. 12. As can be seen from FIG. 12, the pad edge areas of two stacked memory dies 4 which are stacked directly upon each other, are oriented in opposite directions.

FIG. 13 shows a further embodiment of a memory device 1 according to the present invention. In the embodiment as shown in FIG. 13, the highest stacked memory die 4-8 and the memory die directly beneath the highest stacked memory die 4-8, i.e. the memory die 4-7, are stacked upon each other, such that the pad edge areas of both stacked memory dies 4-7, 4-8 are oriented in the same direction. As can be seen from FIG. 13, the die pad 5-8-$i$ of the highest memory die 4-8 and the die pad 5-7-$i$ of the memory die 4-7 under the highest memory die 4-8 of the memory stack 3 are connected directly via a wire bond 7-8-$i$ and then via a further wire bond 7-7-$i$ to a substrate pad 6 of the substrate 2. This embodiment has the advantage that a length of the longest wire bond provided for the highest memory stack 4-8 is reduced. In this embodiment, the die pads 5 of the highest stack memory die 4-8 are bonded to the corresponding die pads 5 of the memory die 4-7 directly beneath the highest memory die 4-8.

Figure 14A:
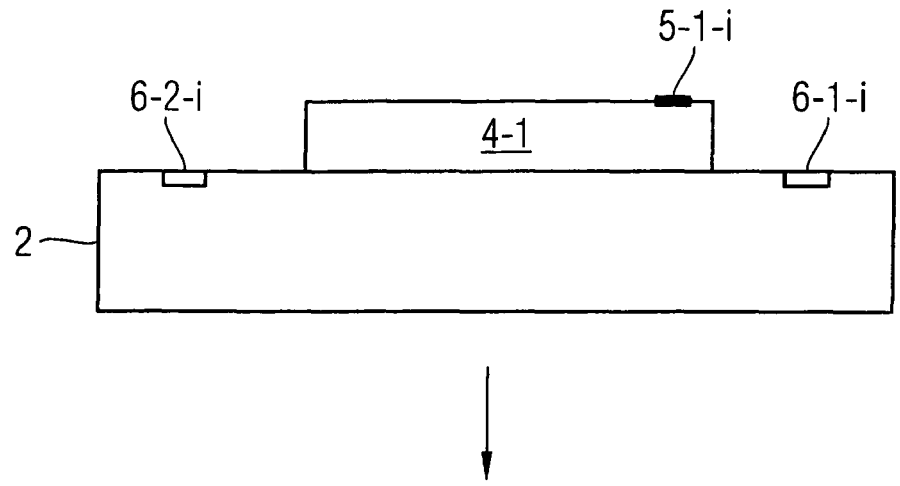
FIGS. 14A, 14B, 14C illustrate the manufacturing process for manufacturing a memory device according to an embodiment of the present invention.
Figure 14B:
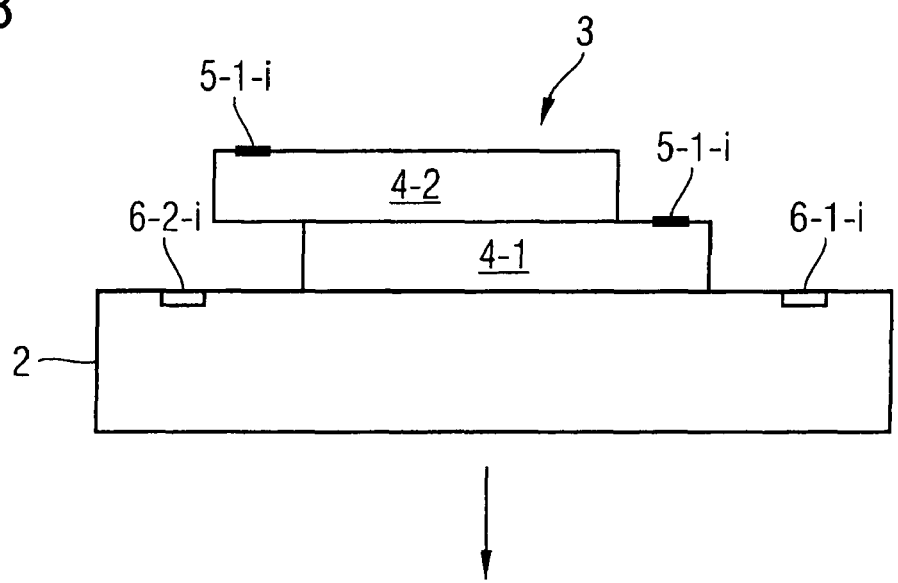
Figure 14C:
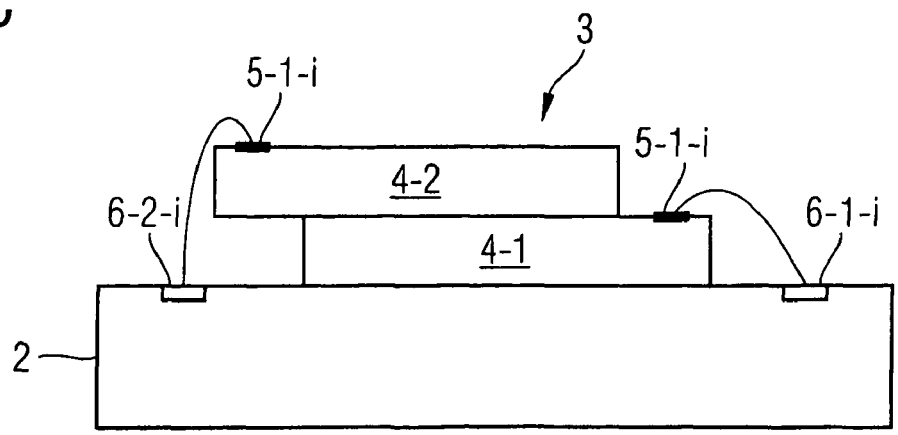

FIGS. 14A, 14B, 14C show a method for manufacturing a memory stack 3 for a memory device 1 according to the present invention for the embodiment shown in FIGS. 12, 13.

First, as can be seen from FIG. 14A, a first memory die 4-1 having die pads 5 arranged on the upper side of the memory die 4 in a pad edge area along an edge of said memory die 4-1 is provided on a substrate 2 comprising substrate pads 6.

The next memory die 4-2 is rotated with respect to the previous memory die 4-1, such that the pad edge area of both memory dies 4-1, 4-2 are oriented in opposing directions, and then the second memory die 4-2 is placed on the upper side of the previous memory die 4-1 in a staggered manner, such that the pad edge area of the underlying previous memory die 4-1 remains uncovered as shown in FIG. 14B.

As shown in FIG. 14C, the die pads 5-1-$i$ and 5-2-$i$ of the two highest stacked memory dies 4-1, 4-2 of the memory stack 3 whose pad edge areas are both uncovered are bonded simultaneously in one wire bonding step to the substrate pads 6-1-$i$ and 6-2-$i$ on the substrate 2 of the memory device 1. These steps are repeated until a predetermined number N of memory dies 4 are stacked upon each other to form a memory stack 3. As becomes evident from FIGS. 14A, 14B, 14C the number of wire bonding steps for generating a memory stack 3 with N stacked memory dies 4 is N/2. Accordingly, the number of necessary wire bonding steps is significantly reduced. In the manufacturing process as shown in FIGS. 14A, 14B, 14C the memory die 4-2 is rotated by 180° with respect to the previous memory die 4-1. In an alternative embodiment, the further memory die 4-2 is rotated by another angle with respect to the previous memory die 4-1, e.g. by a rotation angle of 90°. The memory dies 4 are rotated with respect to each other and than glued together. When the memory stack 3 has been accomplished, the stacked memory dies 4 are molded in a package.

Figure 15A:
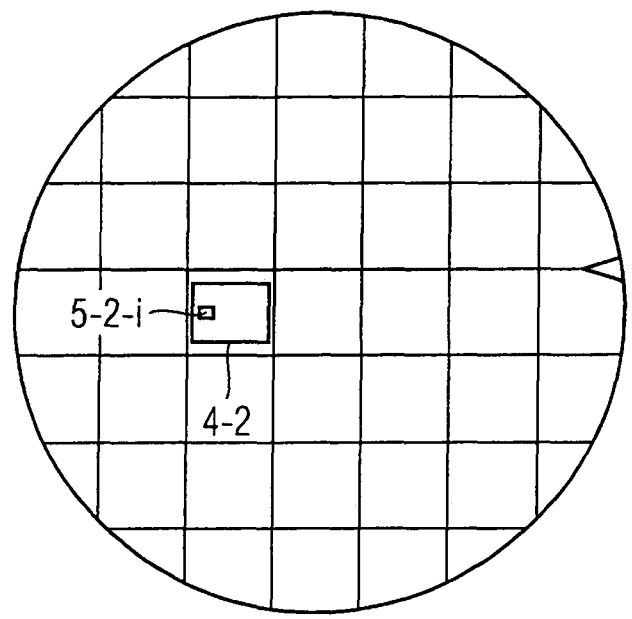
FIGS. 15A, 15B show two chip wafers for illustrating the manufacturing process of a memory device according to an embodiment of the present invention.
Figure 15B:
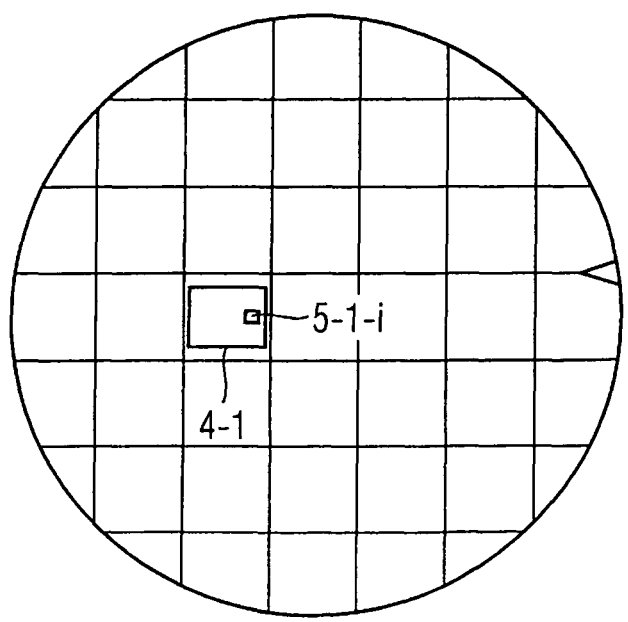

FIGS. 15A, 15B show two wafers each having a plurality of memory dies 4 facing in opposing directions. Each wafer has a notch indicating an orientation of the respective wafer. The memory dies 4 of each wafer are separated from each other and two memory 4 dies are glued together overlapping each other in a symmetric staggered alternating arrangement.

In the embodiment shown in FIG. 12, there are two groups of die pads 5 which are connected to a substrate pad 6 on both sides of the memory stack 3, wherein one group of the die pads 5 is wire bonded to the left side of the memory stack 3 and the other group of die pads 5 is connected to the right side of the memory stack 3. In the example given in FIG. 12, the die pads 5 of the memory dies 4-$i$ with even numbers form the first group and the die pads 5 of memory dies 4-$i$ with odd numbers form the second group. Accordingly, the first group of die pads 5 is formed by die pads 5-2, 5-4, 5-6, 5-8 and the other group of die pads 5 is formed by die pads 5-1, 5-3, 5-5-, 5-7. In a possible embodiment, the die pads 5 of the two different groups are provided for different data channels, thus, simplifying the routing of the substrate pads 6.

Figure 16:
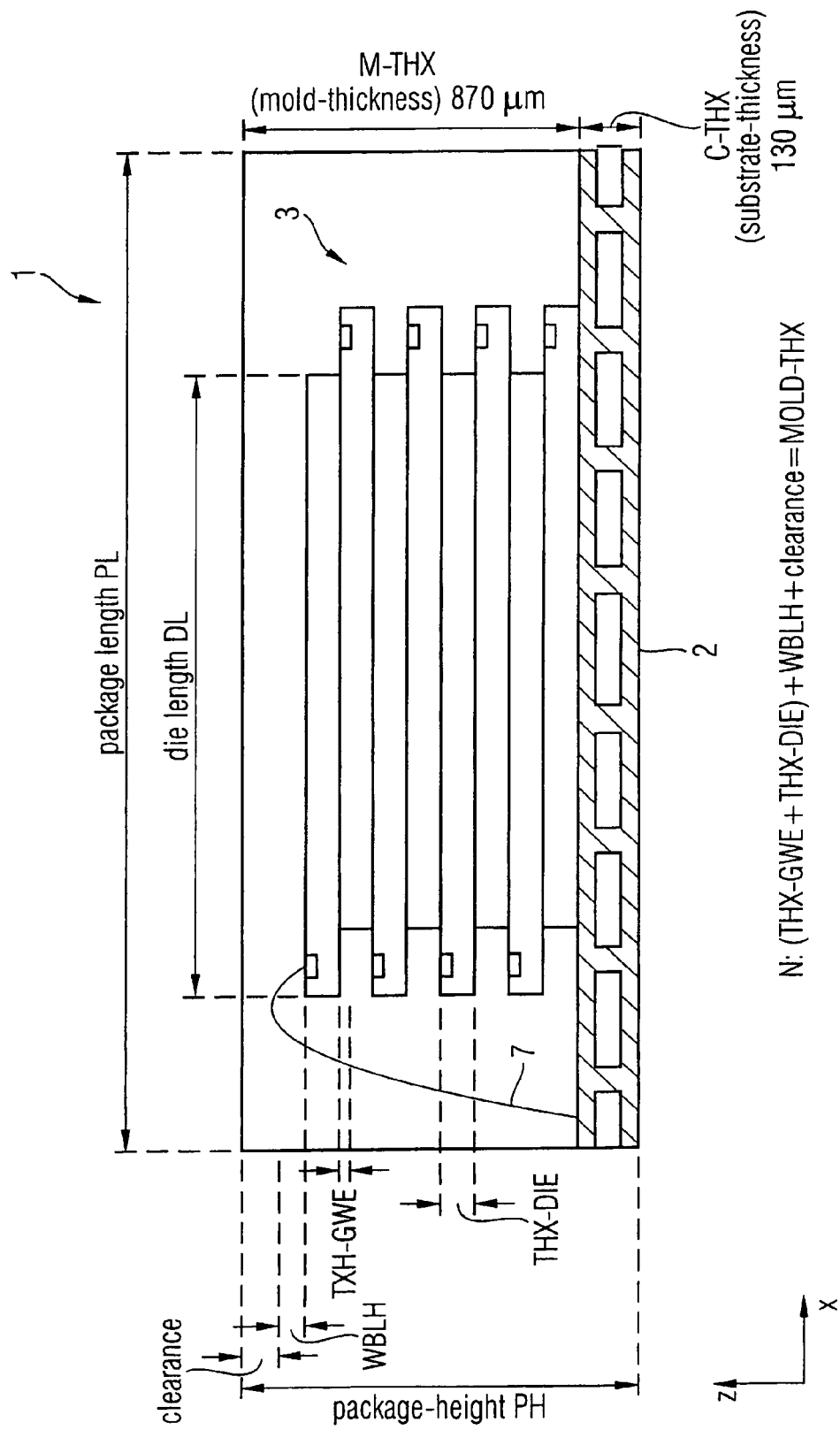
FIG. 16 is a cross section view through a memory device according to an embodiment of the present invention.

FIG. 16 shows a cross section through a memory device 1 according to one embodiment of the present invention comprising stacked memory dies 4 which are stacked upon each other and which are molded in a package. In the embodiment shown in FIG. 16, a mold thickness is 870 μm and the thickness of the substrate is 130 μm so that the total height of the memory device 1 is 1 mm. In the shown embodiment, the thickness of a memory die 4 is 65 μm and the thickness of a glue layer attaching two memory dies 4 together is 15 μm. The number N of memory dies 4 which are stacked upon each other is eight (N=8). Each wire bond 7 has a wire bond loop height WBLH. The distance the highest point of the wire bond 7 of the highest memory die 4 to the upper surface of the mold package is the so-called clearance.

The mold thickness can be calculated as following:

MOLD-$THX$=$N \cdot (THX$-Glue+$THX$-Die)+$WBLH$+ Clearance.

In the embodiment shown in FIG. 16, the height of the memory stack 3 is 8·(15 μm+65 μm)=640 μm. The wire bond loop height is approximately 80 μm. With a mold thickness of 870 μm, the clearance is 150 μm.

Figure 17:
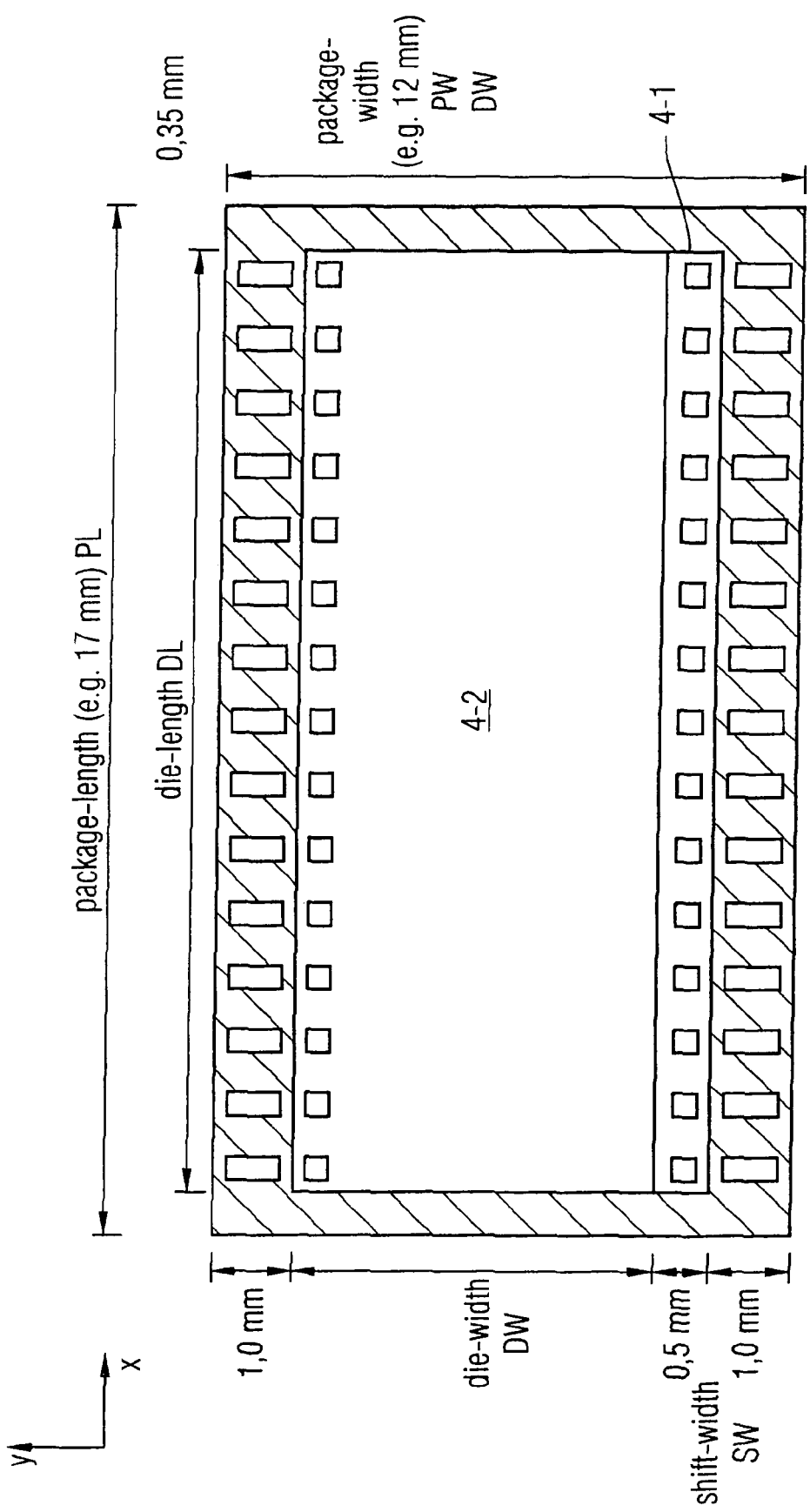
FIG. 17 is a view from above on a memory device according to an embodiment of the present invention.

FIG. 17 shows a view on two stacked memory dies 4 stacked upon each other. In the embodiment shown in FIG. 17, the package length DL depends on the length DL of the memory dies 4 stacked in the memory stack 3.

In the given example, the dimension of the die length DL is given by:

Die Length DL=Package Length PL−2·0.35 mm=17 mm−0.7 mm=16.3 mm.

The package width PW depends on the die width DW.

In the embodiment shown in FIG. 17, the die width DW is calculated as following:

die width D=package width PW−2·1.0 mm−0.5 mm.

For a package width PW of, for instance, 12 mm, the die width DW is 9.5 mm.

Consequently, the area of a memory die 4-$i$ is given by:

die area DA=die width DW·die length DL

DA=9.5 mm·16.3 mm=155 mm$^2$.

The maximum die size which can be integrated in a TLBGA 12 17 1.0 package is therefore 155 mm$^2$.

Figure 18:
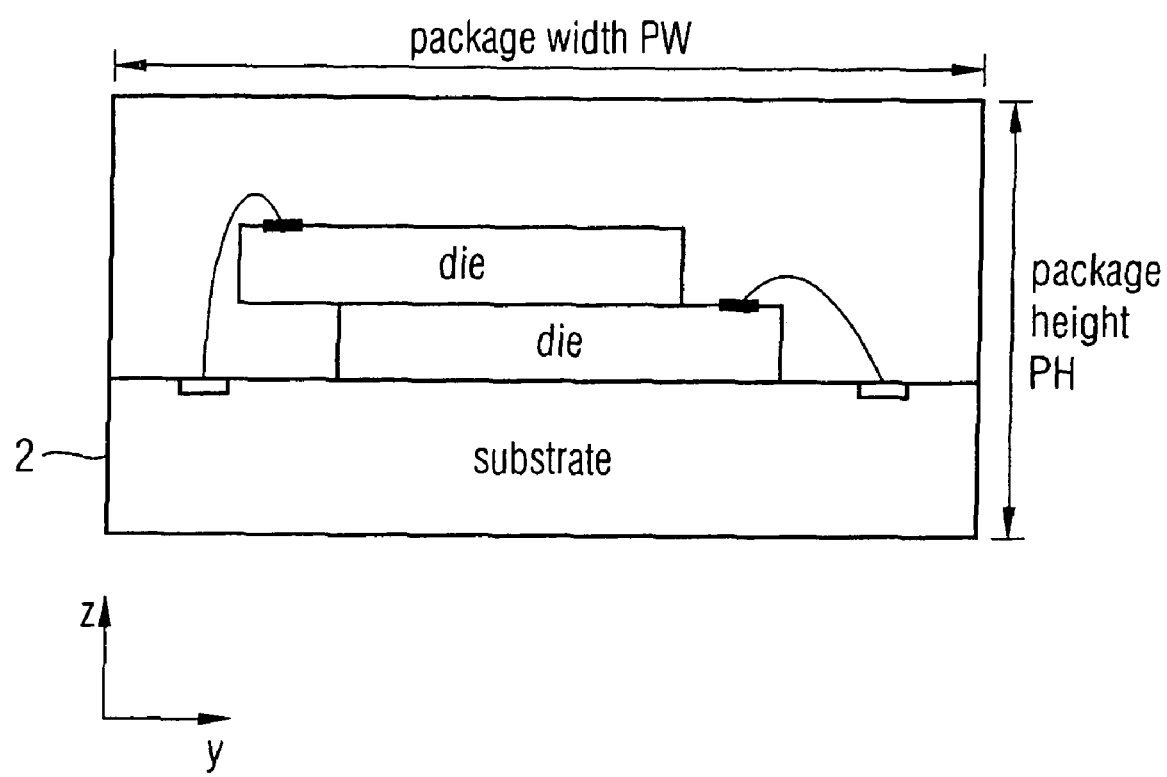
FIG. 18 is a cross section view through a memory device according to an embodiment of the present invention.

FIG. 18 shows a cross section view through the memory device 1 according to the embodiment as shown in FIG. 17.

In the embodiment, the memory device 1 according to the present invention as shown in FIGS. 13, 16, 17, 18, the thickness of the package, i.e. the mold thickness is minimized since the memory dies 4 are attached to each other directly without the need of a spacer. A further advantage of the symmetric staggered alternating arrangement as shown in the cross section of FIG. 18, is that constrains in an y direction are met. Furthermore, by increasing the pitch of critical die pads 5 visual or electrical shorts are avoided. The memory device 1 can be provided for any kind of packages including stacked memory dies or for any format of memory cards, such as flash memory cards or multimedia memory cards MMC. Memory cards can be electronic flash memory cards used with digital cameras, handheld and laptop computers, telephones, music players, video game consoles and other electronics. With the memory device 1 according to the present invention, it is possible to provide ultra-small cards for any kind of device, such as cell phones, PDAs, compact digital cameras etc.

The memory dies 4-$j$ which are stacked upon each other can be formed by a memory die, i.e. memory cells integrated within the memory die 4 or by any other logic circuitry provided in a memory.

With the memory device 1 according to the present invention, the number of stacked memory dies 4 is maximized for a given height of a package and at the same time, the probability for short cuts is minimized increasing the yield and diminishing costs during the manufacturing of the memory device 1. During manufacturing, in particular, the number of wire bonding steps in minimized when staggering the memory dies 4 in a symmetric arrangement. The wire bonds 7 are in an embodiment formed by gold wires. In an alternative embodiment, the wire bonds 7 are formed by copper. The bonding can be performed in both directions, e.g. from the substrate 2 to the memory dies 4 or in the reverse direction from the memory dies 4 to the substrate 2. The die pads 5 are formed in a possible embodiment by aluminium. The substrate pads 6 are formed in a possible embodiment by gold.

The invention claimed is:

1. A memory device, comprising: at least one memory stack of stacked memory dies which are staggered with respect to each other, each stacked memory die of the memory stack comprising:
   first die pads positioned along an edge of each stacked memory die for bonding each stacked memory die individually to substrate pads of the memory device, wherein each one of the first die pads is spaced a first distance from a neighboring one of the first die pads along the edge of the same stacked memory die; and
   second die pads positioned along the edge of each stacked memory die for connecting each stacked memory die in parallel with corresponding second die pads of other stacked memory dies of said the memory stack to corresponding substrate pads of the memory device, wherein each one of the second die pads is spaced the first distance from a neighboring one of the first die pads along the edge of the same stacked memory die and is spaced a second distance from a neighboring one of the second die pads along the edge of the same stacked memory die, and the first distance is greater than the second distance.

2. The memory device according to claim 1, wherein a distance pattern of the first die pads and the second die pads along the edge of a stacked memory die is identical for all stacked memory dies of the memory stack.

3. The memory device according to claim 1, wherein the substrate pads provided on a substrate of the memory device are arranged in at least one row of substrate pads oriented substantially in parallel to an edge of the lowest stack memory die of the memory stack.

4. The memory device according to claim 1, wherein each stacked memory die comprises one pad edge area in which the first die pads and the second die pads of the memory die are arranged.

5. The memory device according to claim 1, wherein the memory dies are stacked upon each other in an asymmetric staggered stair case arrangement.

6. The memory device according to claim 1, wherein the first distance $d_i$ is given by:

$$d_i \geq \frac{N+1}{2} \cdot d_s,$$

wherein
N is the number of the stacked memory dies stacked upon each other in an asymmetric staggered stair case arrangement, and
$d_s$ is a minimal pad distance of substrate pads provided on the substrate of said memory device.

7. The memory device according to claim 6, wherein the minimal pad distance $d_s$ of substrate pads provided on the substrate of the memory device is given by:

$$d_s = 2(h_s - h_0) \cdot \tan\frac{\alpha_{min}}{2},$$

wherein
$h_s$ is a distance between two corresponding die pads of two staggered memory dies of the memory stack,
$h_o$ is a distance between die pads of the lowest memory die of the memory stack and substrate pads provided on a substrate of the memory device, and
$\alpha_{min}$ is a minimum angle avoiding that a bond wire crosses a die pad.

8. The memory device according to claim 7, wherein the minimum angle $\alpha_{min}$ is given by:

$$\alpha_{min} = 2\arctan\left[\frac{w_p}{2} \bigg/ \left(h_s - \frac{h_p}{2}\right)\right],$$

wherein
$w_p$ is the width of a die pad,
$h_p$ is the length of a die pad, and
$h_s$ is the distance between two corresponding die pads of two staggered memory dies of the memory stack.

9. The memory device according to claim 1, wherein the memory dies are stacked upon each other in a symmetric staggered alternating arrangement.

10. The memory device according to claim 9, wherein the stack memory dies are stacked alternating to each other, such that pad edge areas of two memory dies which are stacked directly upon each other are oriented in opposing directions.

11. The memory device according to claim 1, wherein the memory dies are stacked upon each other to form a pyramid of stacked memory dies.

12. The memory device according to claim 1, wherein the stacked memory dies are attached to each other directly.

13. The memory device according to claim 12, wherein the stacked memory dies of said memory stack are glued to each other.

14. The memory device according to claim 1, wherein a spacer is provided between two stacked memory dies of said memory stack.

15. The memory device according to claim 1, wherein the at least one memory stack is molded in a package of the memory device.

16. The memory device according to claim 1, wherein the stacked memory dies are stacked flash memory dies.

17. The memory device according to claim 1, wherein one of the first die pads of the stack memory die which connects said memory die individually to said control circuit is provided for applying a chip enable signal (CE) to the stacked memory die.

18. The memory device according to claim 1, wherein one of the first die pads of the stacked memory die which connects the memory die individually to said control circuit is provided for a read/busy (RB) signal.

19. The memory device according to claim 1, wherein a number N of stacked memory dies of the memory stack is at least four.

20. The memory device according to claim 1, wherein a number N of stacked memory dies of the memory stack is at least eight.

21. The memory device according to claim 1, wherein the substrate pads of the memory device are connectable to a control circuit that is a micro-controller.

22. The memory device according to claim 1, wherein the memory device is a flash memory and wherein the at least one memory stack comprises at least one flash memory stack of stacked flash memory dies which are staggered with respect to each other.

23. The flash memory according to claim 22, wherein the flash memory dies are stacked upon each other in an asymmetric staggered stair case arrangement.

24. The flash memory according to claim 22, wherein the flash memory dies are stacked upon each other in a symmetric staggered alternating arrangement.

* * * * *